US006945828B2

(12) United States Patent
Kamei et al.

(10) Patent No.: US 6,945,828 B2
(45) Date of Patent: Sep. 20, 2005

(54) SENSOR SYSTEM AND CONNECTOR USED THEREFOR

(75) Inventors: Takashi Kamei, Kyoto (JP); Kiyoshi Imai, Kyoto (JP); Toshinori Sato, Kyoto (JP); Kazuaki Miyoshi, Kyoto (JP); Satoru Shimokawa, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/754,552

(22) Filed: Jan. 12, 2004

(65) Prior Publication Data

US 2004/0142602 A1 Jul. 22, 2004

Related U.S. Application Data

(63) Continuation of application No. 09/694,302, filed on Oct. 24, 2000, now Pat. No. 6,692,311.

(30) Foreign Application Priority Data

Oct. 25, 1999 (JP) .......................................... 11-303195
Mar. 31, 2000 (JP) .......................................... 2000-99098

(51) Int. Cl.[7] .................................................. H01R 9/26
(52) U.S. Cl. ....................................... 439/717; 439/218
(58) Field of Search ................................ 439/716, 715, 439/717, 218, 222–224, 638, 640, 928, 650–651, 907, 631, 214, 290, 709–712, 532, 350, 355, 353, 385, 284; 307/42, 117, 32

(56) References Cited

U.S. PATENT DOCUMENTS

| | | |
|---|---|---|
| 3,550,063 A | 12/1970 | Lecocq |
| 4,322,120 A | 3/1982 | Rilling |
| 4,401,351 A | 8/1983 | Record |
| 4,445,741 A | 5/1984 | Annoot |
| 4,477,862 A | 10/1984 | Gonzales |
| 5,818,123 A | 10/1998 | Iwasaki et al. |
| 5,876,252 A | 3/1999 | Hahn et al. |
| 5,920,197 A | 7/1999 | Price et al. |
| 6,033,264 A | 3/2000 | Feye-Hohmann |
| 6,045,399 A | 4/2000 | Yu |

FOREIGN PATENT DOCUMENTS

| | | |
|---|---|---|
| JP | 53-115393 | 9/1978 |
| JP | 62-274576 | 11/1987 |
| JP | 1-67783 | 11/1989 |
| JP | 1-167783 | 11/1989 |
| JP | 1-91287 | 3/1991 |
| JP | 3-30382 | 3/1991 |
| JP | 04-033288 | 3/1992 |
| JP | 4-129981 | 11/1992 |
| JP | 7-220796 | 8/1995 |
| JP | 9-64712 | 3/1997 |
| JP | 9-199217 | 7/1997 |
| JP | 10-303952 | 11/1998 |
| JP | 11-054227 | 2/1999 |

*Primary Examiner*—Tho D. Ta
*Assistant Examiner*—Felix O. Figueroa
(74) *Attorney, Agent, or Firm*—Foley & Lardner LLP

(57) ABSTRACT

A sensor system includes a plurality of sensor bodies arranged aligned and adjacent to each other, each of said sensor bodies being connected to an electric cord including at least a signal line via a connector. Each connector has a power feed terminal, and a detachable fitting for electrically connecting the power feed terminals of the connectors is provided between the connectors. The power supplied to the connector of any of the sensor body through the power feed line in the electric cord is distributed to the power feed terminal of another sensor body through a row of connectors. By this configuration, the number of power feed lines for the overall system can be significantly reduced, and common bodies not distinguished for the main and sub bodies can be used as the sensor bodies, whereby the cost can be reduced and inventory management can be facilitated. Further, when any of the sensor bodies fails, it is possible to simply exchange the failed sensor body only, while maintaining the use of the electric cord that has been used.

8 Claims, 18 Drawing Sheets

SENSOR SYSTEM AND CONNECTOR USED THEREFOR

CROSS-REFERENCE TO RELATED PATENT APPLICATIONS

This application is a Continuation of U.S. application Ser. No. 9/694,302, filed Oct. 24, 2000 now U.S. Pat No. 6,692,311, incorporated herein by reference in its entirety, and claims priority to Japanese applications JP 2000-99098, filed Mar. 31, 2000, incorporated herein by reference in its entirety, and JP 11-303195, filed Oct. 25, 1999, incorporated herein by reference in its entirety.

BACKGROUND OF THE INVENTION

1. Field of the Invention

The present invention relates to a sensor system in which a plurality of sensor bodies of a number of head separation type sensors (for example, fiber type photoelectric sensors, ultrasonic sensors, proximity sensors and the like) are arranged aligned with each other by means of a DIN (Deutsche Institute Normenausschuss) rail or the like.

2. Description of the Background Art

In the technical field of FA (Factory Automation), for example, head separation type sensors (for example, fiber type photoelectric sensors, ultrasonic sensors, proximity sensors and the like) are widely used to detect presence/absence and positions of objects. When a fiber type photoelectric sensor is used, for example, a sensor head for emitting and receiving a detection beam (red light beam, infrared ray or the like) is placed in a narrow space near an object of detection, while a sensor body containing a light emitting element and a light receiving element is accommodated in a control panel placed away from the object of detection, with the sensor head and a sensor body coupled by an optical fiber. Generally, the outer shape of the sensor body casing is a thin rectangular cube. When a number of sensor bodies are to be accommodated in the control panel, the bodies are typically arranged in contact with each other to form a row, using the DIN rail.

FIG. 17 schematically shows an example of a sensor system in which sensor bodies of fiber type photoelectric sensors (hereinafter simply referred to as "sensor bodies") are arranged in contact with each other to form a row. As can be seen from FIG. 17, a plurality of sensor bodies 402 for detecting different objects are arranged in a row in the transverse direction on a DIN rail 401 mounted in the control panel. From a front surface of each of the sensor bodies 402, optical fibers 403 and 404 constituting outgoing and returning paths for the detection beam, respectively, are drawn out, and from the rear end surface of the case, an electric cord 405 including a power feed line 405*a* and a signal line 405*b* (see FIG. 18) is drawn out.

When a detection beam path 408 is opened for transmission or intercepted between sensor head portions 403*a* and 404*a* at the tip ends of optical fibers 403 and 404, internal circuitry of the sensor body functions, and a detection signal (a switching signal or an analog signal corresponding to the amount of received light) is externally output through the signal line 405*b* in the electric cord 405. The detection signal is supplied as a control input, to a programmable logic controller (PLC) 407, as shown in FIG. 18.

Further, as shown in FIG. 18, power supply from a power source 406 to each of the sensor bodies 402 is effected through the power feed line 405*a*. Power feed line 405*a* includes two, that is, positive and negative, lines.

In this manner, in the conventional photoelectric sensor systems in which a number of sensor bodies 402 are arranged aligned with each other and in contact with each other, it is necessary to supply power to each of the photoelectric sensor bodies 402 through power feed line 405*a* in the electric cord. Therefore, for the electric cord, a cord having a large number of core lines is necessary, and, in addition, it takes time and labor just to connect these lines.

A structure saving lines in this type of photoelectric sensor system has been known, as described in Japanese Patent Laying-Open No. 9-64712. According to the technique described in this Laid-Open Application, the sensor system includes one main sensor (body) and a plurality of sub sensors (bodies) arranged in a row and in contact with the main sensor and with each other. An electric cord including both the signal line and the power feed line is main sensor, and an electric cord including the signal line only is connected to each sub sensor, by joining means that will fix the position such as solder. On the side surfaces of the cases of the main and sub sensors, there are a male junction and female junction to provide interface between neighboring sensors. When the main sensor is connected to a sub sensor and the neighboring sub sensors are connected to each other by connected to the these joints, the power supplied to the main sensor through the electric cord is successively passed through a conductor in each sensor case, to the series of sub sensors.

In the sensor system described in Japanese Patent Laying-Open No. 9-64712, feeding and receiving of power through the conductors in the sensor cases through the male and female joints connecting the neighboring sensor bodies with each other is possible, whereby the reduction of lines can be achieved, as power supply to individual sub sensor through the electric cord is made unnecessary.

In such a sensor system, however, two different sensor bodies, that is, one having such a structure that receives external power through the electric cord, and one having such a structure that receives power through the male and female joints from the neighboring sensor body are necessary. This means that the number of parts and the steps of parts management increase, resulting in increased cost. Further, inventory management of the sensor bodies is troublesome, as there are two different types of the sensor bodies.

Further, when trouble occurs in any of the sensors (main or sub), it becomes necessary to change the electric cord connected to the defective sensor at the same time. This requires time consuming and troublesome work of disconnecting the bundle of electric cords and newly connecting substitute electric cords, and material waste increases.

SUMMARY OF THE INVENTION

An object of the present invention is to provide a sensor system which can significantly reduce the number of power feed lines in the overall system, which enables a decrease in costs and simplified inventory management by adopting sensor bodies of common structure not distinguished for the main or sub sensor, and, in case any malfunction occurs in any of the sensor bodies, enables exchange of the defective sensor body only, while the electric cords that have been used so far can be maintained.

Another object of the present invention is to provide a connector system which can flexibly cope with increase/decrease of the number of sensors arranged, when a plurality of sensor bodies are to be arranged in a row, and which can maintain minimum number of power feed lines regardless of the number of sensors to be arranged.

A further object of the present invention is to provide a main connector suitable for implementing the above described power feed connector system.

A still further object of the present invention is to provide a sub connector suitable for implementing the above described power feed connector system.

The above described objects can be attained by the sensor system in accordance with the present invention, including a plurality of sensor bodies arranged aligned and adjacent to each other, and a plurality of connectors detachably coupled to the sensor bodies and detachably coupled to neighboring connectors.

Here, "sensor" includes head separation type sensors such as a fiber type photoelectric sensor, an ultrasonic sensor, a proximity sensor and the like. Generally, the sensor system of this type consists of the sensors of the same type. The present invention, however, is also applicable to a sensor system in which various sensors mentioned above are used mixed with each other.

The sensor body is provided with a joint for the connector enabling detachable coupling with the corresponding connector, and the connector is provided with a joint for the sensor body enabling detachable coupling with the corresponding sensor body.

The "joint for the connector" on the sensor body includes at least a power receiving terminal for receiving, from the connector, the power to be fed to the internal electric circuitry. Here, "at least" means that there may possibly be one, two or more signal terminals in addition to the power receiving terminal.

The "joint for the sensor body" on the connector includes at least a power feed terminal for feeding power to the internal electric circuitry of the sensor body. Here again, "at least" is used to include possible additional terminals.

The sensor body and a connector are detachably coupled through the joints of each other. When the sensor body and a connector are coupled, the power receiving terminal of the joint for the connector is electrically connected to the power feed terminal of the joint for the sensor body. Thus, a power feed path from the connector to the sensor body is established.

Preferably, the direction of attachment/detachment when a sensor body and a connector are coupled is orthogonal to the direction of coupling between the sensor bodies with each other. This arrangement facilitates attachment/detachment between the sensor body and a connector, without the necessity of providing a large space between the sensors. Further, it may be preferred if a specific sensor body is detachable, while the coupled state of the connector is maintained.

Here, "a plurality of connectors" includes at least one main connector and one or two or more sub connectors. In other words, there may be two or more main connectors.

The main and sub connectors are provided with a joint for neighboring connector, enabling detachable coupling with the neighboring connectors.

The "joint for the neighboring connector" of the main connector includes at least a power feed terminal for supplying the power introduced from the power supply line to a neighboring connector.

The "joint for the neighboring connector" of the sub connector includes a joint for the neighboring connector including at least a power receiving terminal for receiving power from one neighboring connector, and a joint for the neighboring connector including at least a power feed terminal for feeding the power received by the power receiving terminal to another neighboring connector.

The neighboring connectors are detachably coupled through the joints for the reciprocal neighboring connectors. At this time, the power feed terminal provided in the joint for the neighboring connector of one connector is electrically connected to the power receiving terminal provided in the joint for the neighboring connector of the other connector. Thus, a power feeding and receiving path from one connector to the other connector is established.

More specifically, the main connector and a sub connector are detachably coupled through the joint for the neighboring connector of the main connector and the joint for the neighboring connector of the sub connector. At this time, the power feed terminal of the main connector is electrically connected to the power receiving terminal of the sub connector. Thus, a power feeding and receiving path from the main connector to the sub connector is established.

The sub connector coupled to the main connector and another sub connector adjacent to this sub connector are detachably coupled through the joints for the neighboring connectors of themselves, and at this time, the power feed terminal of that sub connector which is next to the main connector is electrically connected to the power receiving terminal of that sub connector which is next to the sub connector.

By successively coupling one or a plurality of sub connectors to at least one main connector, a row of connectors is formed, and a series of power feeding and receiving path starting from the main connector is established.

Preferably, the joint for the neighboring connector of the main connector is provided on the side surface only on which a neighboring connector exists, and not on the other side surface. Therefore, when the main connector is arranged at an end of a row of sensors, the power feed terminal is not exposed at the side where the neighboring connector does not exist. Therefore, the risk of an electrical short-circuit or receiving an electric shock by accidentally touching the power feed terminal can be avoided.

Each joint for the neighboring connector of the main and sub connectors has a connecting structure for establishing mechanical and electrical connections with the neighboring connector. Here, the power receiving terminal and the power feed terminal of each joint for the neighboring connector are included in the connecting structure for establishing the electrical connection.

Preferably, the connecting structure of the joint for the neighboring connector including a power receiving terminal of the sub connector preferably has a projecting portion protruding to a connector neighboring the joint. The connecting structure of the joint for the neighboring connector of the main connector and of the joint for the neighboring connector of the sub connector including the power feed terminal has a recessed portion receiving the projecting portion of the connector neighboring the joint, and the connecting structure does not have the projecting portion protruding toward the neighboring connector. In such a structure, the connecting structure of connector does not protrude from either end of the row of sensors. As there is no projection on either end of the row of sensors, it becomes possible to arrange other device not requiring power connection by the connector in tight contact with the row of sensors. Further, the situation where an operator's clothes or the like are accidentally caught on the projection or something hitting the projection can be avoided.

The main connector is connected to an electric cord including at least a power feed line, and the main connector includes an internal conductor for leading the power supplied from the electric cord to the power feed terminal provided at the joint for the sensor body and to the power feed terminal provided at the joint for the neighboring connector, inside the main connector.

More specifically, in the main connector, the power introduced from the electric cord is supplied through the internal conductor to the power feed terminals of the joint for the sensor body and a joint for the neighboring connector and further, the power is passed to the sensor body and to the power receiving terminal of the neighboring sub connector, from the power feed terminals.

Further, the sub connector includes an internal conductor for leading the power received through the power receiving terminal provided at one joint for the neighboring connector to the power feed terminal provided at the joint for the sensor body and to the power feed terminal provided at the other joint for the neighboring connector, within the sub connector.

More specifically, in the sub connector, the power received by the power receiving terminal is supplied through the internal conductor to the power feed terminal provided at the joint for the sensor body and to the power feed terminal provided at the joint for the neighboring connector, and further, from these power feed terminals to the neighboring connector and the power receiving terminal of the sensor body.

In this manner, by coupling an arbitrary number of sub connectors to the main connector, it becomes possible to feed the power fed to the main connector through the electric cord to each sensor body through the row of connectors.

The sensor system of the present invention provides a power feed line by means of a connector system including a main connector to which an electric cord including at least a power feed line is connected, and one or a plurality of sub connectors electrically connected to the main connector. Therefore, simply by coupling the main connector and the sub connector to the sensor bodies and by coupling neighboring connectors with each other, the power can be supplied to each sensor body. Therefore, the power feed line have only to be connected to the main connector, and hence the power feed line is unnecessary for the sub connectors. Therefore, the number of lines for the overall system can be reduced.

Further, as the connector and a sensor body can be detachably coupled, it is possible, when any trouble occurs in the sensor body, to detach the sensor body from the corresponding connector, and to solve the problem simply by exchanging the sensor body. More specifically, re-connection of electric cords and a control equipment such as the PLC and associated works of binding of the lines when the sensor body is exchanged in the conventional system, can be avoided.

Further, if it is made possible to draw out the sensor body from the connector while maintaining coupling of adjacent connectors with each other, even when the aligned arrangement of the sensor bodies in the system is disconnected because of a failure of any sensor body, for example, power feed to the sensor bodies succeeding the defective portion is continued.

The connector system of the present invention is also applicable for power connection between sensors of the same type but of different specifications, as in the case of photoelectric sensors in accordance with different specifications, as well as to power connections of sensors of different types, as in the case of a photoelectric sensor and a proximity sensor. In such a case, what is necessary in designing the sensor body is simply to consider the position of the connector, so as to enable connection between neighboring connectors with each other.

When the connector system of the present invention is applied, limitations in the design of the sensor body as expected when the structure for electrical connection with an adjacent sensor body is to be provided on the sensor body itself, can be eliminated.

The sensor body designed corresponding to the connector system of the present invention may be used connected to the maul connector and not electrically connected to other sensors. In such a case, the sensor may be used as a sensor having similar function and appearance to the conventional sensor to which the electric cord is detachably attached.

The sensor body designed corresponding to the connector system of the present invention may be used connected to the connector of the conventional structure not having the connecting structure with the neighboring connector. In this case, the electrical connecting structure to the neighboring sensor unnecessary in such use, is absent.

As described above, as the electrical connecting structure is provided in the connector, the user of the sensor can flexibly select an optimal system dependent on the intended use, using the sensor body standardized to be used with the connector system of the present invention.

In a preferred embodiment of the present invention, in addition to the power feed line, one or two or more signal lines are included in the electric cord introduced to the main connector, and corresponding number of signal terminals are provided at the joint for the sensor body of the main connector. Further, the main connector includes therein an internal conductor connecting respective ones of the signal lines of the electric cord to the corresponding signal terminals on the side of the joint for the sensor body, respectively.

Further, an electric cord including one or two or more signal lines is introduced to the sub connector, and the corresponding number of signal terminals are provided at the joint for the sensor body of the sub connector. Further, the sub connector includes therein an internal conductor coupling the signal lines of the electric cord with the corresponding signal terminals at the side of the junction for the sensor bodies, respectively.

Therefore, each connector provides, in addition to the power feed function for the sensor body, the function of connecting the signal terminals in the sensor body with the signal terminals in the electric cord.

More specifically, it becomes possible to feed power to the sensor body and to transmit/receive a signal between the sensor body and a control device such as a PLC, through the connector.

Further, in this case also, the connector and a sensor body is detachably coupled. Therefore, when there is a trouble in the sensor body, it is possible to detach the corresponding sensor body from the corresponding connector, and to exchange the sensor body only, and the trouble is eliminated. More specifically, re-connection between the electric cords and a control device and the like and associated binding when the sensor body is exchanged in the conventional system, can be avoided.

Further, in a sensor system in which exchange of signals between adjacent sensor bodies is possible, drawing out the electric cord for signal output from each sensor becomes unnecessary. In that case, the sub connector will be simply a connector used for power feed only.

As described above, according to the present invention, the power feed line is unnecessary for the connectors other than the main connector. Therefore, the number of power feed lines can significantly be reduced for the overall system. Further, because sensor bodies having the same structure are employed for both the main and sub sensors, the cost can be reduced and inventory management is made easier. Further, if a failure occurs in any of the sensor bodies, it is possible to simply exchange the defective sensor body only, while maintaining the electric cords used up to that point in time.

Further, according to the present invention, when a plurality of sensor bodies are arranged in a row and in contact with each other, the number of sensors to be arranged can be flexibly changed, and the minimum number of power feed lines can be maintained regardless of the number of sensors to be arranged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the sensor system in accordance with the present invention and the connectors used therefor will be described in detail with reference to the appended drawings.

Figure 1:
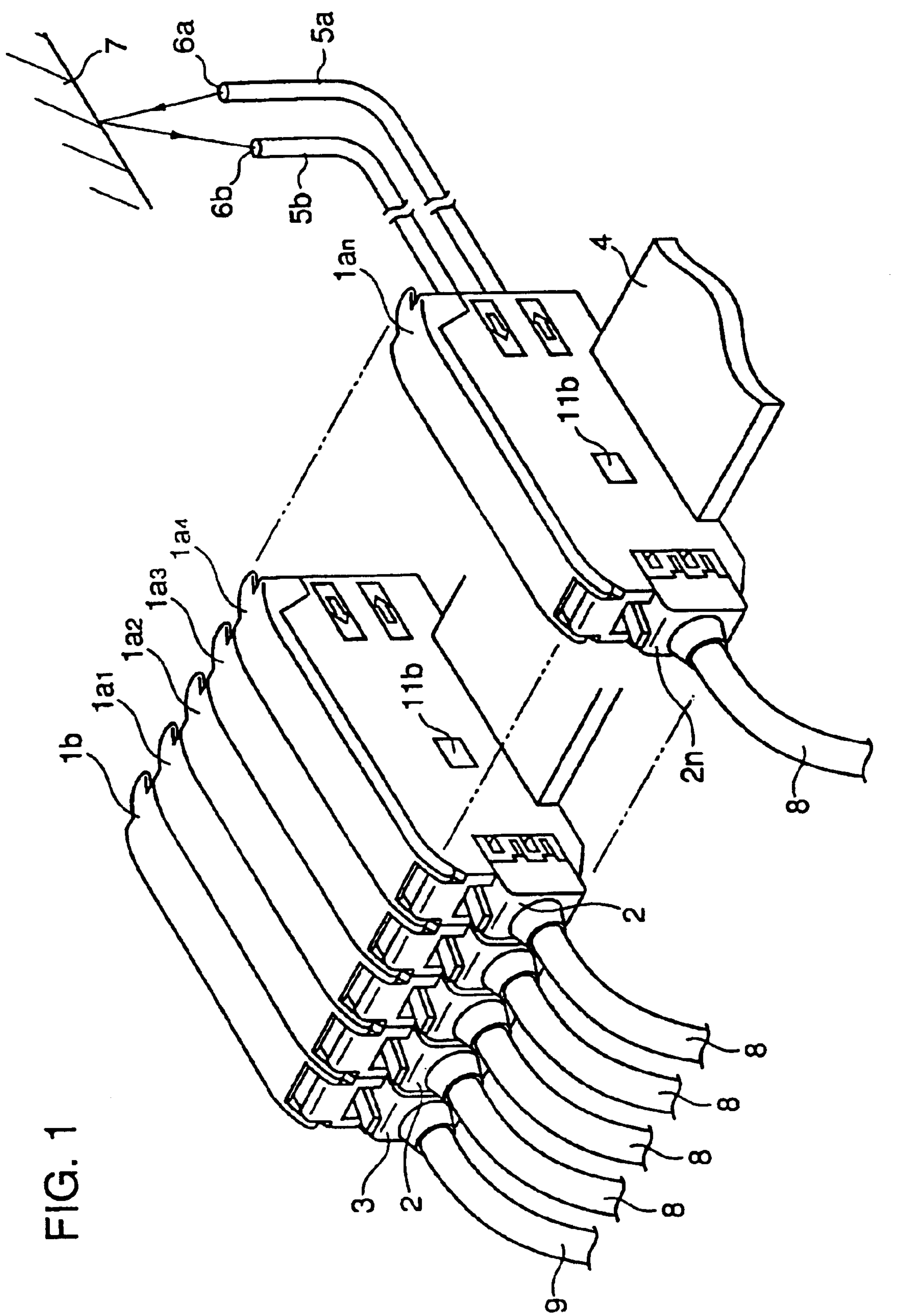
FIG. 1 is a perspective view showing an appearance of the overall sensor system in accordance with an embodiment of the present invention.
Figure 2A:
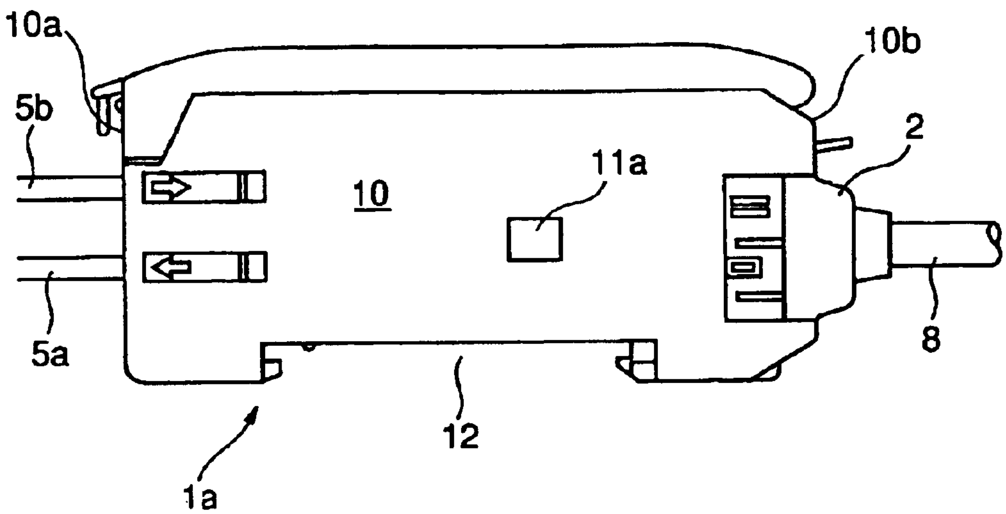
FIG. 2A is a side view of the sensor body to which a sub connector of the sensor system shown in FIG. 1 is connected.
Figure 2B:
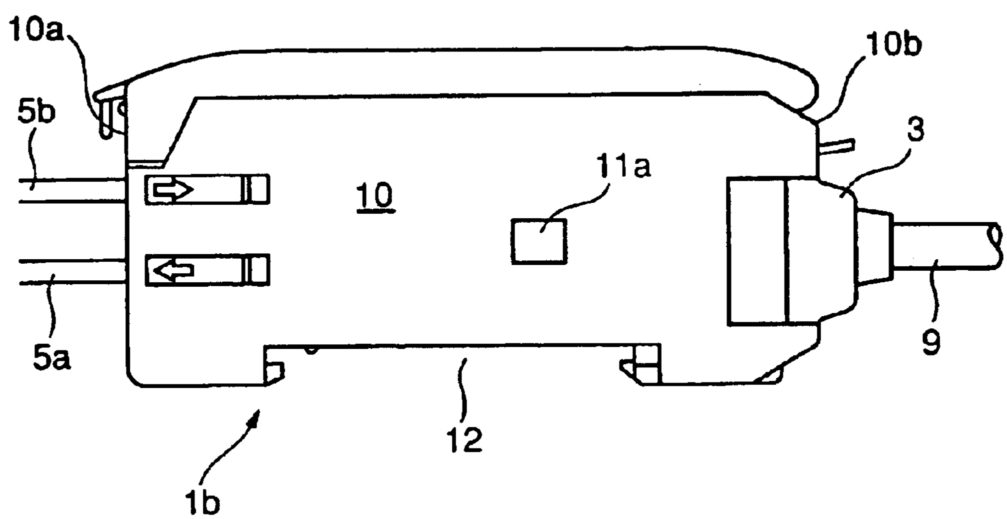
FIG. 2B shows a side view of the sensor body to which a main connector is connected.
Figure 3:
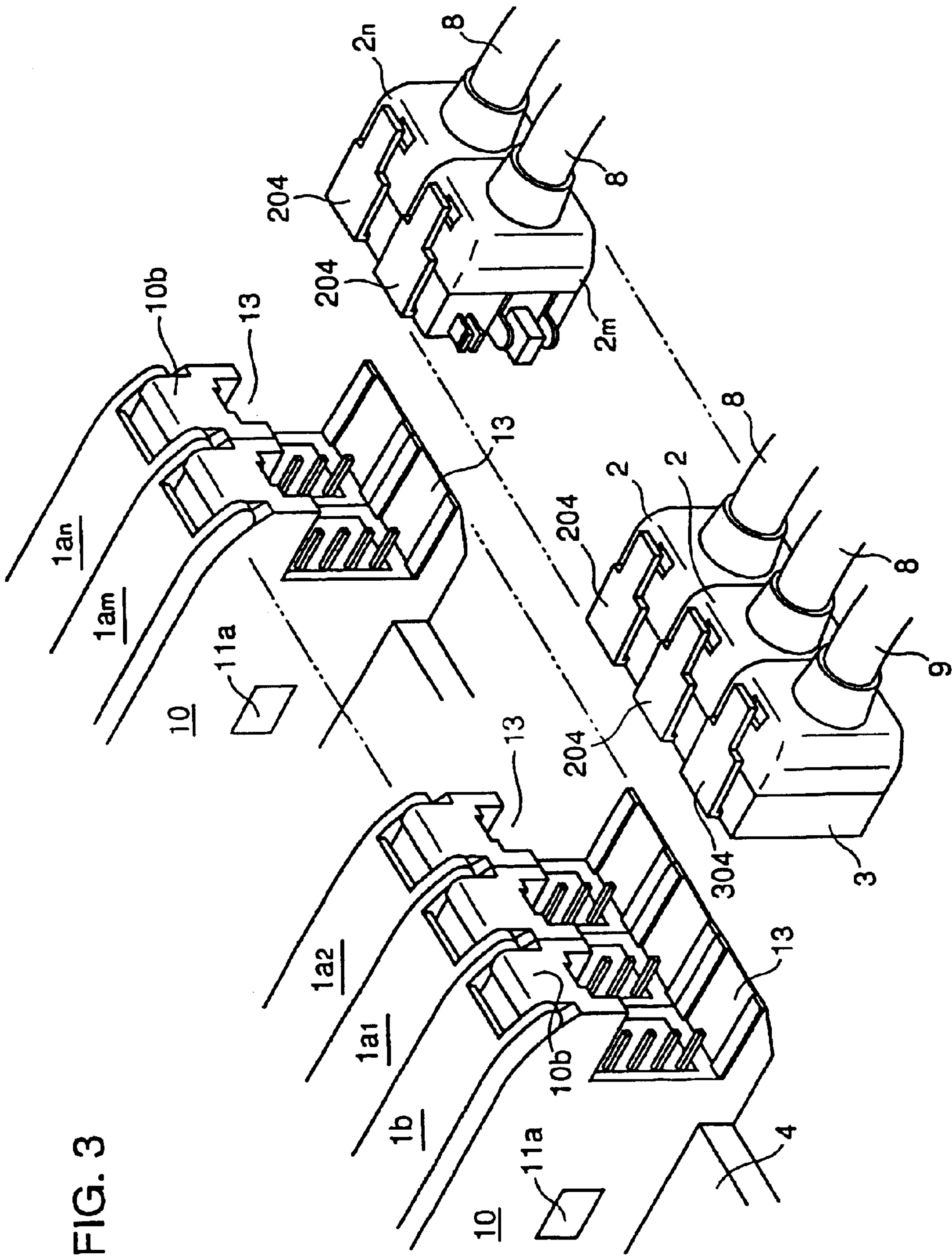
FIG. 3 is a perspective view showing the connectors of the sensor system shown in FIG. 1 separated from the sensor bodies.

FIG. 1 is a perspective view showing the overall appearance of the sensor system in accordance with the present invention, FIG. 2 includes side views of the sensor body and the connector when coupled, FIG. 3 is a perspective view showing the appearance of the sensor bodies separated from the connectors, and FIG. 4 includes side views of the sensor body and the connector separated from each other.

As can be seen from FIG. 1, the sensor system in accordance with the present embodiment is implemented as a sensor system including a plurality of fiber type photoelectric sensors.

The sensor system includes a plurality or sensor bodies 1 (1*b*, 1$a_1$ to 1*an*) arranged aligned and in contact with each other, and a plurality of connectors (one main connector 3 and a plurality of sub connectors 2) that are detachably coupled to the sensor bodies 1 and detachably coupled to neighboring connectors with each other.

Sensor bodies 1 are arranged in tight contact with each other on a DIN rail 4, in this example. To the sensor body 1*b* which is arranged at an end portion of the system (left end of the figure when viewed from the front), a main connector 3 is connected. A plurality of sensor bodies 1$a_1$ to 1*an* arranged aligned and in contact with each other to form a row following the right side of the sensor body 1*b* are connected to sub connectors 2.

FIG. 2A shows the sensor body 1*a* connected with sub connector 2, and FIG. 2B shows the sensor body 1*b* connected with main connector 3. As is apparent from these figures, in the present embodiment, the sensor bodies 1*a* and 1*b* to which the sub connector 2 and the main connector 3 are connected are of the same specification. More specifically, different from the conventional sensor system having the line saving structure, it is unnecessary to prepare the sensor bodies of two different structures as the main sensor fed from an electric cord and a sub sensor fed from the neighboring sensor.

In this example, the sensor body 1 has a flat, approximately rectangular sensor case 10. On opposing side surfaces of sensor case 10, a pair of light emitting and receiving windows 11*a* and 11*b* for optical communication are provided. Between neighboring sensors, infrared ray is emitted/received through the emitting and receiving windows 11*a* and 11*b*, enabling various settings and adjustment of the photoelectric sensors.

In sensor case 10, a control panel, not shown, is attached. On the control panel, various circuits such as a power supply circuit, a measurement control circuit, and a communication circuit within neighboring units, light emitting elements and light receiving elements for optical communication between neighboring sensors and so on are mounted. Further, there is a rail receiving portion 12 at the bottom surface of sensor case 10, for mounting sensor body 1 on the DIN rail 4.

From a front surface 10*a* of sensor case 10, optical fibers 5*a* and 5*b* are drawn out, and tip ends of optical fibers 5*a* and 5*b* form sensor head portions 6*a* and 6*b* as shown in FIG. 1. The photoelectric sensor detects presence/absence and states and the like of an object 7, by emitting and receiving a red light beam through the sensor head portions 6*a* and 6*b*.

On a rear surface 10*b* of sensor case 10, main connector 3 or sub connector 2 is connected. Further, an electric cord 9 is drawn out from main connector 3, and an electric cord 8 is drawn out from sub connector 2, respectively.

Figure 4A:
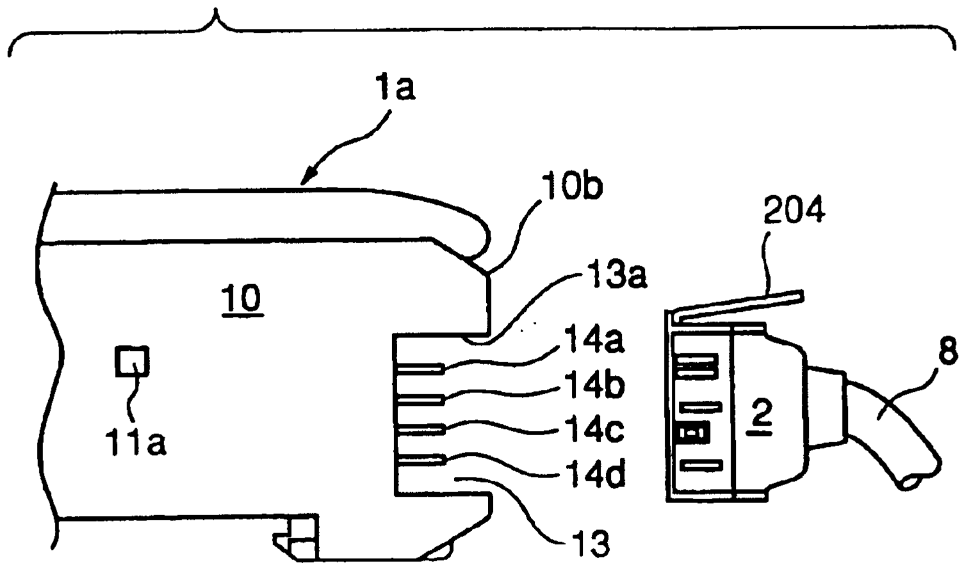
FIG. 4A is a side view of the sensor body with the sub connector separated, corresponding to FIG. 2A.
Figure 4B:
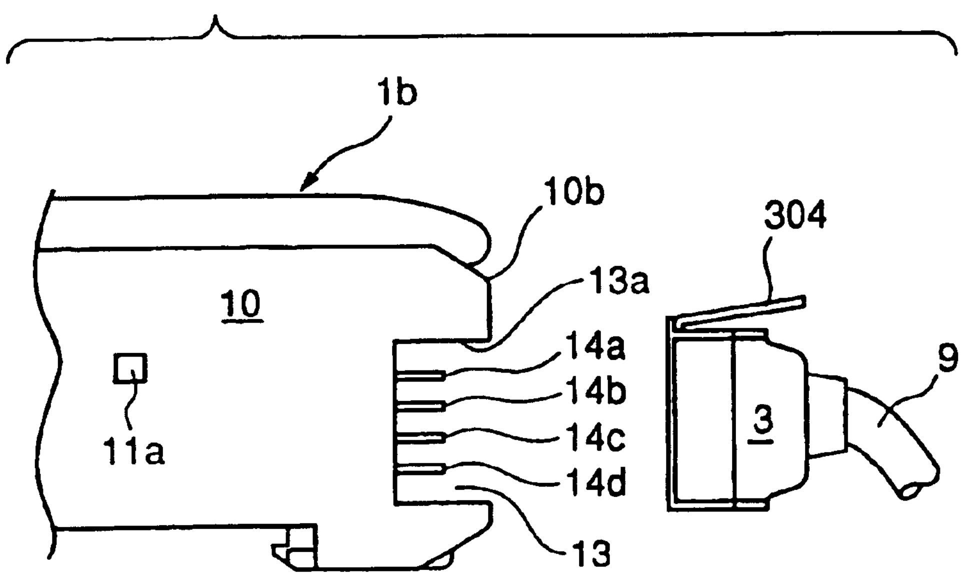
FIG. 4B is a side view showing the sensor body with the main connector separated, corresponding to FIG. 2B.

FIG. 3 and the side views of FIGS. 4A and 4B show the sensor bodies 1 (1*a*, 1*b*) and connectors 2, 3 separated from each other. FIG. 4A shows sensor body la separated from sub connector 2, and FIG. 4B shows sensor body 1*b* separated from main connector 3, respectively.

As shown in FIGS. 3 and 4A and 4B, a joint 13 for the connector is formed on the rear surface 10*b* of sensor body 1 (1*a*, 1*b*). By means of the joint 13 for the connector and a joint (shown by the reference character 24 in FIG. 6) for the sensor body of the connector not shown in these figures, the sensor body 1 and each of the connectors 2 and 3 are detachably coupled.

On the upper surfaces of connectors 2 and 3, elastic projection pieces 204 and 304 having a stepped portion are provided, respectively. At a ceiling surface 13*a* of the joint 13 for connector of sensor body 1, an engaging piece for engaging with the elastic projection pieces 204, 304 at the stepped portion is provided. This prevents disengagement of the connectors 2, 3 with the sensor body 1, when the connector and the sensor body are connected.

At the joint 13 for the connector, four terminal pins 14*a* to 14*d* protrude from the inside of sensor case 10 toward the direction of connection between the sensor body 1 and a connector (along the lengthwise direction). These four terminal pins 14*a* to 14*d* are arranged at a prescribed pitch interval in the up/down direction, and used as a control output terminal pin (signal terminal pin) 14*a*, a power receiving terminal pin 14*b*, an analog output terminal pin (signal terminal pin) 14*c* and a power receiving terminal (ground side) pin 14*d*, in this order from the uppermost one. The terminal pins 14 are electrically connected to a circuit board, not shown, forming an internal electric circuit within the sensor case, and therefore, power feed from connector 2 or 3 to sensor body 1 and signal output from the sensor body 1 to the connector are possible through the terminal pins 14*a* to 14*d*.

The structure of sub connector 2 will be described in detail with reference to FIGS. 5 to 9.

Figure 5A:
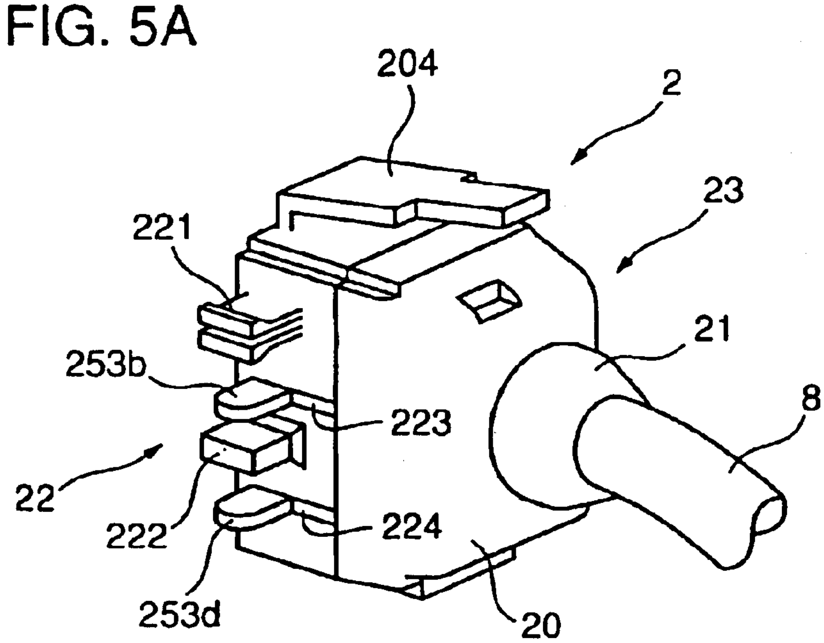
FIGS. 5A and 5B are perspective views of the appearance of the sub connector of the sensor system shown in FIG. 1, viewed from two different directions.
Figure 5B:
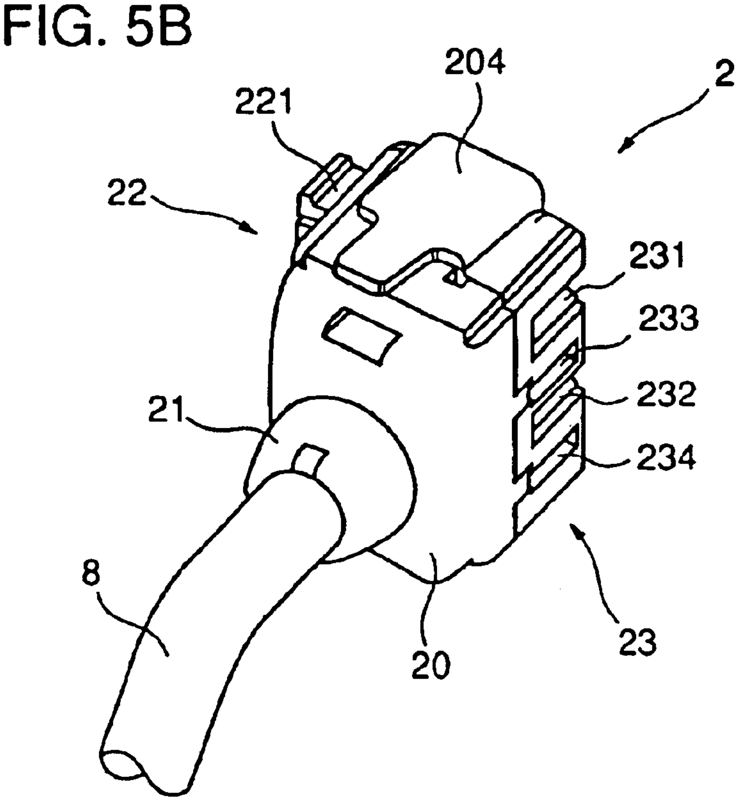
Figure 6:
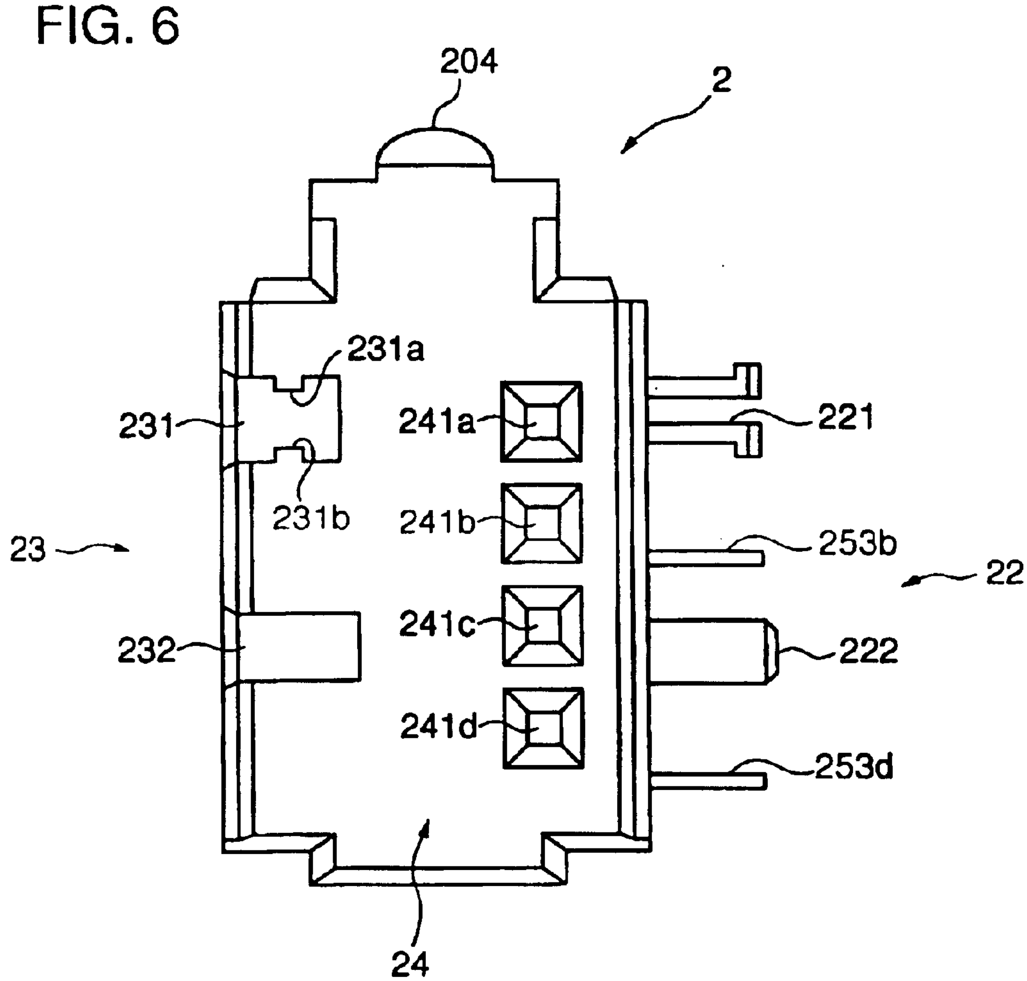
FIG. 6 shows the sub connector of FIGS. 5A and 5B viewed from the side of the sensor body.
Figure 7:
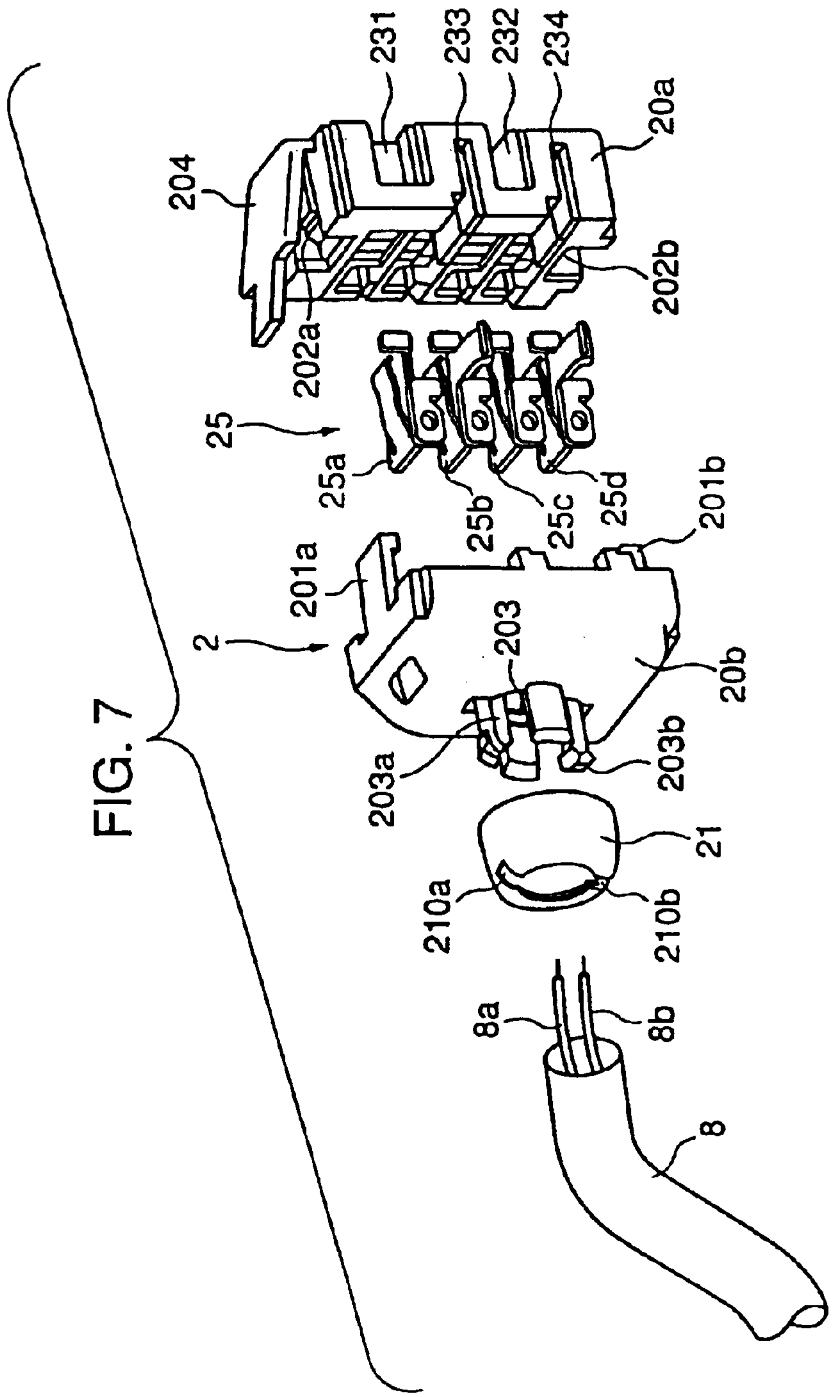
FIG. 7 is an exploded perspective view of the sub connector shown in FIGS. 5A and 5B viewed from behind one side.
Figure 8:
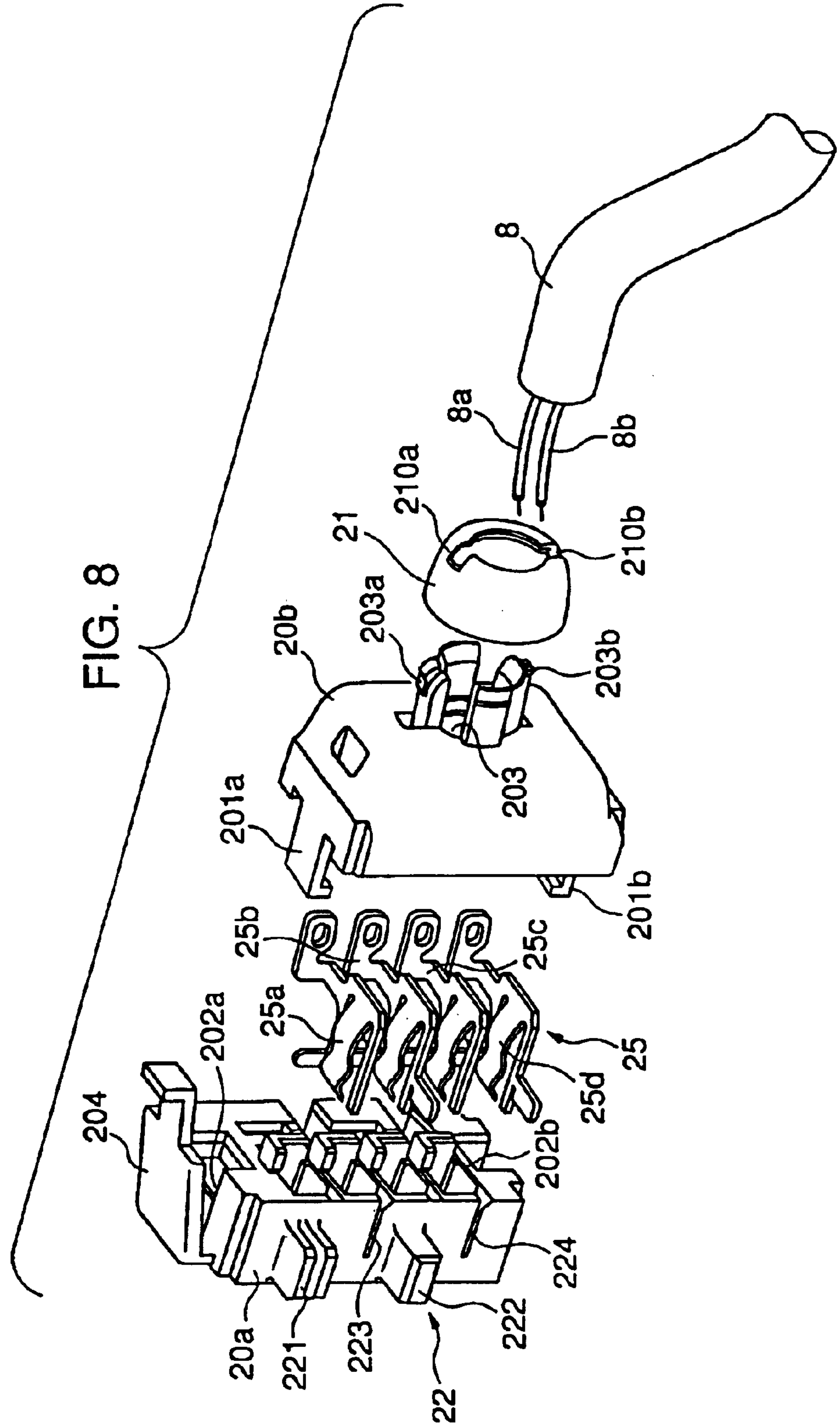
FIG. 8 is an exploded perspective view of the sub connector shown in FIGS. 5A and 5B viewed from behind the opposing side from FIG. 7.

As shown in FIGS. 5 to 8, sub connector 2 has a connector housing 20 formed of an insulating body. As shown in FIGS. 7 and 8, respectively, connector housing 20 is formed divided into two pieces, that is, a front connector housing 20*a* having the joint for the sensor body (represented by reference character 24 in FIG. 6) and a rear connector housing 20*b* having an inlet for introducing the electric cord.

A pair of claw-shaped projection pieces 201*a* and 201*b* extending horizontally toward the front connector housing 20*a* protrude from upper and lower end portions of rear connector housing 20*b*. The claw-shaped projection pieces 201*a* and 201*b* are engaged with engaging projections 202*a* and 202*b* provided at upper and lower end portions of the front connector housing 20*a*, whereby disengagement or slipping of the connector housing 20*a* and 20*b*, when the housing are coupled, is prevented.

On the back surface of rear connector housing 20*b*, an electric cord inlet 203 is provided, and from an edge of electric cord inlet 203, a pair of claw-shaped projection pieces 203*a* and 203*b* for fixing a stopper ring 21 from the inside are provided protruded rearward. Here, stopper ring 21 is provided for preventing slipping of electric cord 8 out from the connector housing 20. The stopper ring 21 is attached after the electric cord 8 is inserted to electric cord inlet 203 of rear connector housing 20*b*, by engaging the claw-shaped projection pieces 203*a* and 203*b* with the stepped portions 210*a* and 210*b* provided on stopper ring 21. Accordingly, the electric cord 8 is pinched from above and from below by claw-shaped projection pieces 203*a* and 203*b*, whereby slipping out of electric cord 8 is prevented.

As can be seen from the perspective view of FIG. 5A, front view of FIG. 6 and the exploded perspective view of FIG. 8, there is provided a joint 22 for a neighboring connector for power reception, having a power receiving terminal (power receiving terminal portions 253*b*, 253*d* of internal conductor pieces 25*b* and 25*d* for power feeding) for receiving power from the neighboring connector. The power receiving terminals (power receiving terminal portions 253*b* and 253*d* of internal conductor pieces 25*b* and 25*d* for power feed) will be described in detail later.

Joint 22 for the neighboring connector for power reception has, in addition to the power receiving terminal (power receiving terminal portions 253*b*, 253*d*), a clip piece 221 and a columnar insertion piece 222. Clip piece 221 includes a pair of elastic pieces each having a projection at the tip end provided parallel to each other in the up/down direction. The insertion piece 222 is a columnar projection for preventing rattling when neighboring connectors are coupled to each other, and it is provided below clip piece 221.

As shown in the perspective view of FIG. 5B, front view of FIG. 6 and exploded perspective view of FIG. 7, on the right side surface (the side surface which will be father from the main connector 3) of rear connector housing 20*b*, there is provided a joint 23 for the neighboring connector for power feed, including a power feed terminal (power feed terminal portions 254*b* and 254*d* for the neighboring connectors of internal conductor pieces 25*b* and 25*d* for power feed) for feeding and receiving power to and from the neighboring connectors. The power feed terminal (internal conductor pieces 25*b* and 25*d* for power feed and power feed terminal portions 254*b* and 254*d*) will be described in detail later.

At the joint 23 for the neighboring connector for power feed, there is provided, in addition to the power feed terminal (power feed terminal portions 254*b*, 254*d* of internal conductor pieces 25*b*, 25*d* for power feed), an engaging slot 231 to be engaged with clip piece 221 and an engaging slot 232 to which the columnar insertion piece 222 is inserted, arranged along the up/down direction. The engaging slot 231 has stepped portions 231*a* and 231*b* to receive and engage with the projections at the tip ends of clip piece 221, as shown in FIG. 6.

Neighboring connectors are electrically and mechanically connected with each other by means of the joint 22 for the neighboring connector for power reception of one connector and the joint 23 for the neighboring connector for power feed of the other connector. More specifically, the insertion piece 222 of one connector is inserted to the slot 232 of the other connector, and at the same time, the clip piece 221 of the one connector is inserted to the engaging slot 231 of the other connector, for coupling with each other. At this time, as the clip piece 221 is engaged with the engaging slot 231, the coupling between the connectors is secured.

More specifically, clip piece 221 and insertion piece 222 are the projections as mechanical structures for connection with the neighboring connector, and power reception terminal portions 253*b* and 253*d* are projections as electric structures for connection with the neighboring connector. Further, the engaging slot 231 and a slot 232 are the recessed portions as the mechanical structures for connection with the neighboring connector, and engaging holes 233 and 234 having power feed terminal portions 254*b* and 254*d* therein, which will be described later, are recessed portions as electrical structures for connection with the neighboring connector.

As shown in FIG. 6, on a front surface of sub connector 2 (on the side of the sensor body), there is a joint 24 for the sensor body. The joint 24 for the sensor body has four slots 241*a* to 241*d* to which the four terminal pins 14*a* to 14*d* of sensor body 1 can be inserted.

Inside the slots 241*a* to 241*d*, there are arranged power feed terminals (power feed terminal portions 251*b* and 251*d* for the sensor body of internal conductor for power feed) for feeding power from sub connector 2 to sensor body 1, and signal terminals (signal terminal portions 251*a*, 251*c* of internal conductor pieces 25*a* and 25*c* for the signals) for receiving signal data passed from the sensor body 1. The signal terminals (signal terminal portions 251*a*, 251*c* of internal conductor pieces 25*a* and 25*c* for the signals) will be described in detail later.

When sensor body 1 and sub connector 2 are connected, four terminal pins 14*a* to 14*d* of sensor body 1 are inserted to corresponding slots 241*a* to 241*d*, respectively, enabling feeding of power from the sub connector 2 to the sensor body 1 and signal transmission from sensor body 1 to sub connector 2.

As shown in FIGS. 7 and 8, connector housing 20 accommodates a distributor 25 having independent four conductor pieces 25*a* to 25*d.*

At a joining surfaces of front connector housing 20*a* and rear connector housing 20*b*, accommodating recessed portions are provided, allowing mounting of these four conductor pieces 25*a* to 25*d* not in contact with each other. As the conductor pieces 25*a* to 25*d* are fitted in the accommodating recessed portions, the conductor pieces are positioned and fixed at appropriate intervals, within the connector housing 20.

Figure 9A:
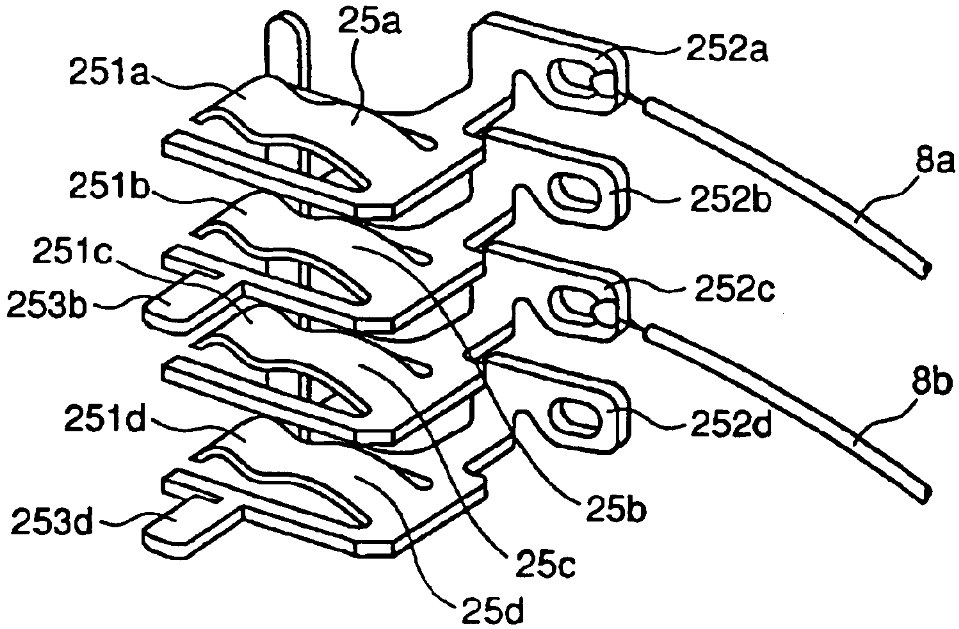
FIGS. 9A and 9B are enlarged perspective views showing the appearance of the distributor used for the sub connector of the sensor system shown in FIG. 1, viewed from two different directions.
Figure 9B:
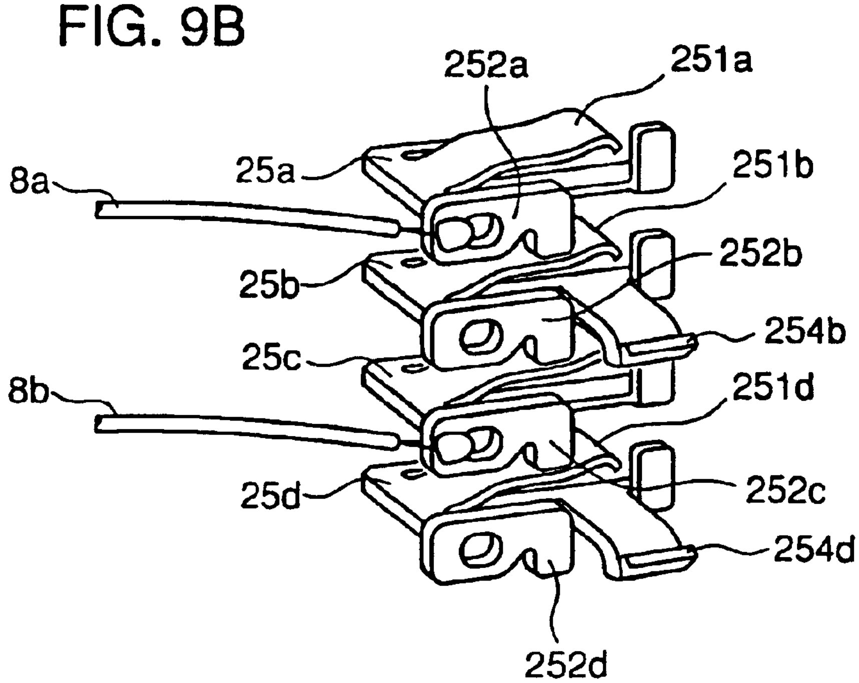

As is apparent from the enlarged perspective view of FIG. 9, conductor pieces 25*a* to 25*d* have terminal portions (signal terminal portions 251*a*, 251*c* and power feed terminal portions 251*b* and 251*d* for the sensor body) electrically connected to and corresponding to terminal pins 14*a* to 14*d* protruded from the sensor body 1, respectively. The terminal portions 251*a* to 251*d* are made resilient to ensure secure contact with the terminal pins 14*a* to 14*d* of sensor body 1 within the slots 241*a* to 241*d*. The terminal portions 251 are arranged at prescribed positions inside the slots 241*a* to 241*d.*

The conductor pieces 25*a* to 25*d* have terminal portions 252*a* to 252*d* for line connection, for connecting various electric lines to the conductor 25 by fixing means such as the solder. The uppermost conductor piece 25*a* and third conductor piece 25*c* from the top are signal conductor pieces for electrically connecting the signal lines 8*a* and 8*b* contained in electric cord 8 to signal terminal pins 14*a* and 14*c* of sensor body 1, respectively.

Signal line 8*a* is connected to the electrical connection terminal portion 252*a* of signal conductor piece 25*a*, and signal line 8*b* is connected to line connection terminal portion 252*c* of signal conductor piece 25*c*, respectively.

The signal terminal pins 14*a* and 14*c* of sensor body 1 are inserted to terminal pin slots 241*a* and 241*c* shown in FIG. 6. At this time, signal terminal portion 251*a* of signal conductor piece 25*a* and signal terminal portion 251*c* of signal conductor piece 25*c* are brought into resilient contact with signal terminal pins 14*a* and 14*c* to raise the pins from below, respectively, whereby the signal terminal pins 14*a* and 14*c* of the sensor body 1 are brought into contact with the signal terminal portions 251*a* and 251*c* of sub connector 2.

More specifically, when sensor body 1 and sub connector 2 are connected, signal lines 8*a* and 8*b* contained in electric cord 8 are electrically connected to signal terminal pins 14*a* and 14*c* of the sensor body 1 through signal conductor pieces 251*a* and 251*c* of sub connector 2, respectively.

The second conductor piece 25*b* from the top and the lowermost (fourth) conductor piece 25*d* are power internal conductor pieces, for feeding the power received from the neighboring connector on the left side (closer to the main connector in the present embodiment) to the neighboring connector on the right side, and to feed the power to the sensor body 1.

Power conductor pieces 25*b* and 25*d* have power receiving terminal portions 253*b* and 253*d* for receiving power from a neighboring connector on one side. As shown in FIG. 5A, receiving terminal portions 253*b* and 253*d* are arranged with tip portions protruded outward from connector housing 20 toward the neighboring connector, through slot 223 provided between clip piece 221 and inserting piece 222 and through the slot 224 provided below inserting piece 222, of the joint 22 for the neighboring connector for power reception, respectively.

Further, power conductor pieces 25*b* and 25*d* have power feed terminal portions 254*b* and 254*d* for the neighboring connector, for feeding power to the neighboring connector on the other side. Power feed terminal portions 254*b* and 254*d* are made resilient so as to establish pressure contact with power receiving terminal portions 253*b* and 253*d* of the neighboring connector from above, when connected to the neighboring connector. As shown in FIG. 5B, power feed terminal portions 254*b* and 254*d* are placed in an engaging hole 233 provided within engaging slot 231 and slot 232 and in engaging hole 234 provided below slot 232, of the joint 23 for the neighboring connector for power feed, respectively. The line connecting terminal portions 252*b* and 252*d* of conductor pieces 25*b* and 25*d* are not used in the present embodiment.

With such a structure, when connected to the neighboring connector on the left side (closer to the main connector), the power receiving terminal portions 253*b* and 253*d* of sub connector 2 are in pressure contact from above with the power feed terminal portions 254*b* and 254*d* of the neighboring connector in engaging holes 233 and 234 of the neighboring connector, and thus electrically connected with each other.

In the similar manner, when coupled to the neighboring connector on the right side (farther from the main connector), the power feed terminal portions 254*b* and 254*d* press the power receiving terminal portions 253*b* and 253*d* of the neighboring connector to be in contact with and electrically connected to each other.

When sensor body 1 is coupled to sub connector 2, power receiving terminal pins 14*b* and 14*d* of sensor body 1 are inserted to terminal pin slots 241*b* and 241*d* shown in FIG. 6, respectively. At this time, the resilient terminal portion 251*b* of power conductor piece 25*b* presses terminal pin 14*b* and resilient terminal portion. 251*d* of conductor piece 25*d* presses terminal pin 14*d*, respectively from below, and are electrically connected to each other.

More specifically, the power feed terminal portions 254*b* and 254*d* of the neighboring connector on the left side, the power receiving terminal pins 14*b* and 14*d* of sensor body 1, and power receiving terminal portions 251*b* and 251*d* of the neighboring connector on the right side are electrically connected with each other, respectively.

Referring to FIG. 1, for the nth sub connector 2*n* arranged on the right end of the sensor system when viewed from the front side of this figure, there is no neighboring sub connector on the right side. Here, the power is passed from the nth sub connector 2*n* only to the sensor body 1.

Figure 10A:
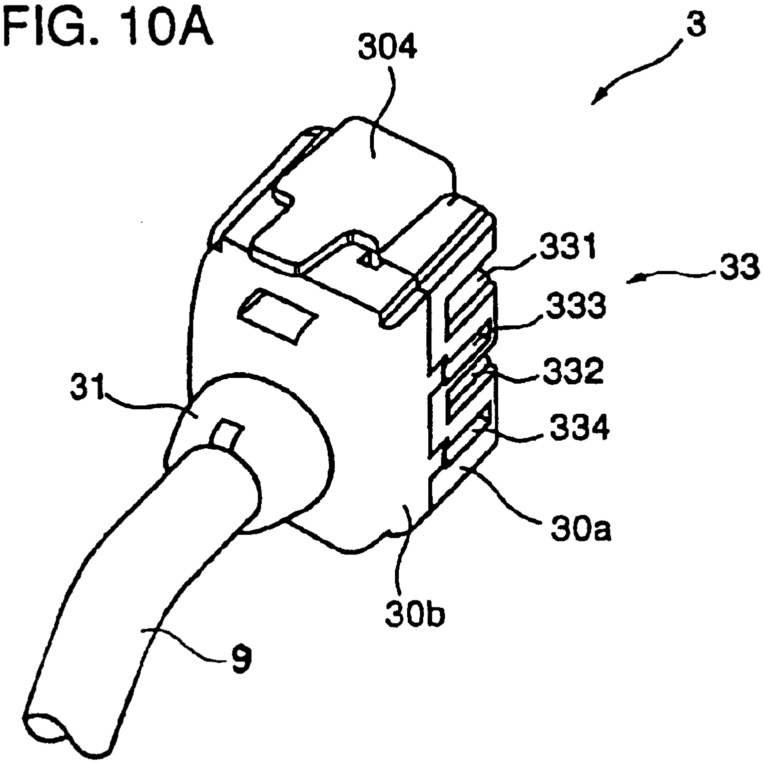
FIGS. 10A and 10B are perspective views showing the appearance of the main connector of the sensor system shown in FIG. 1, viewed from two different directions.
Figure 11:
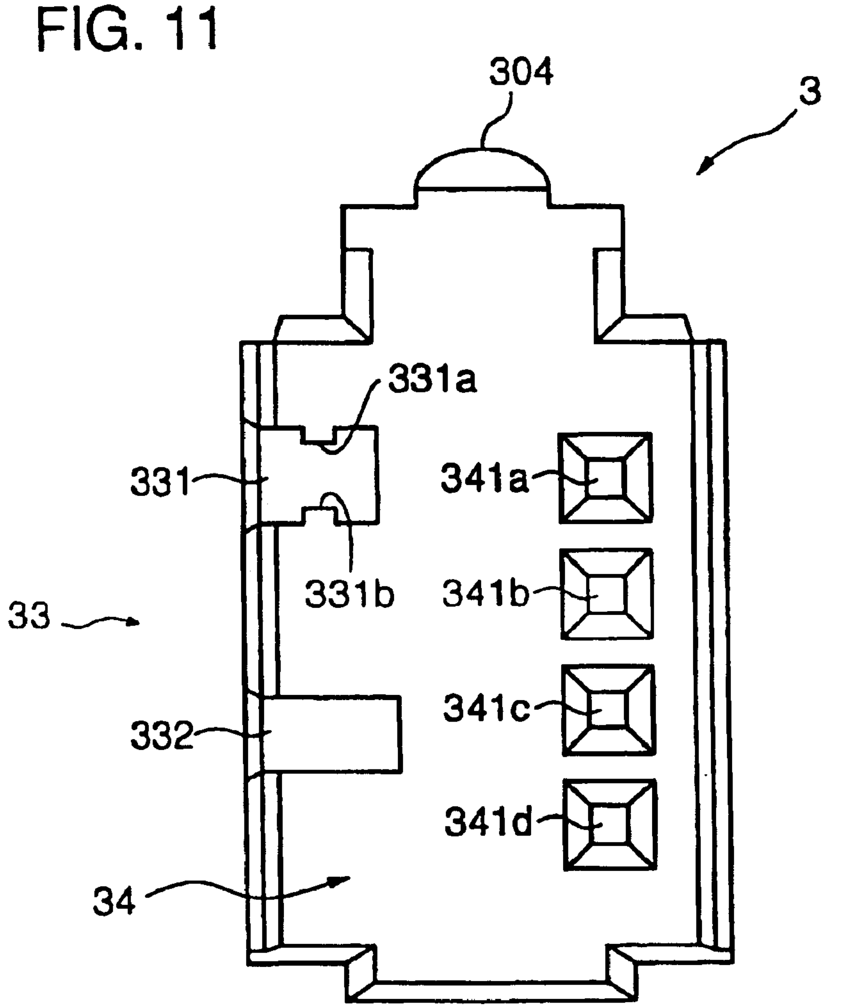
FIG. 11 shows the main connector of FIGS. 10A and 10B viewed from the side of the sensor body.
Figure 12:
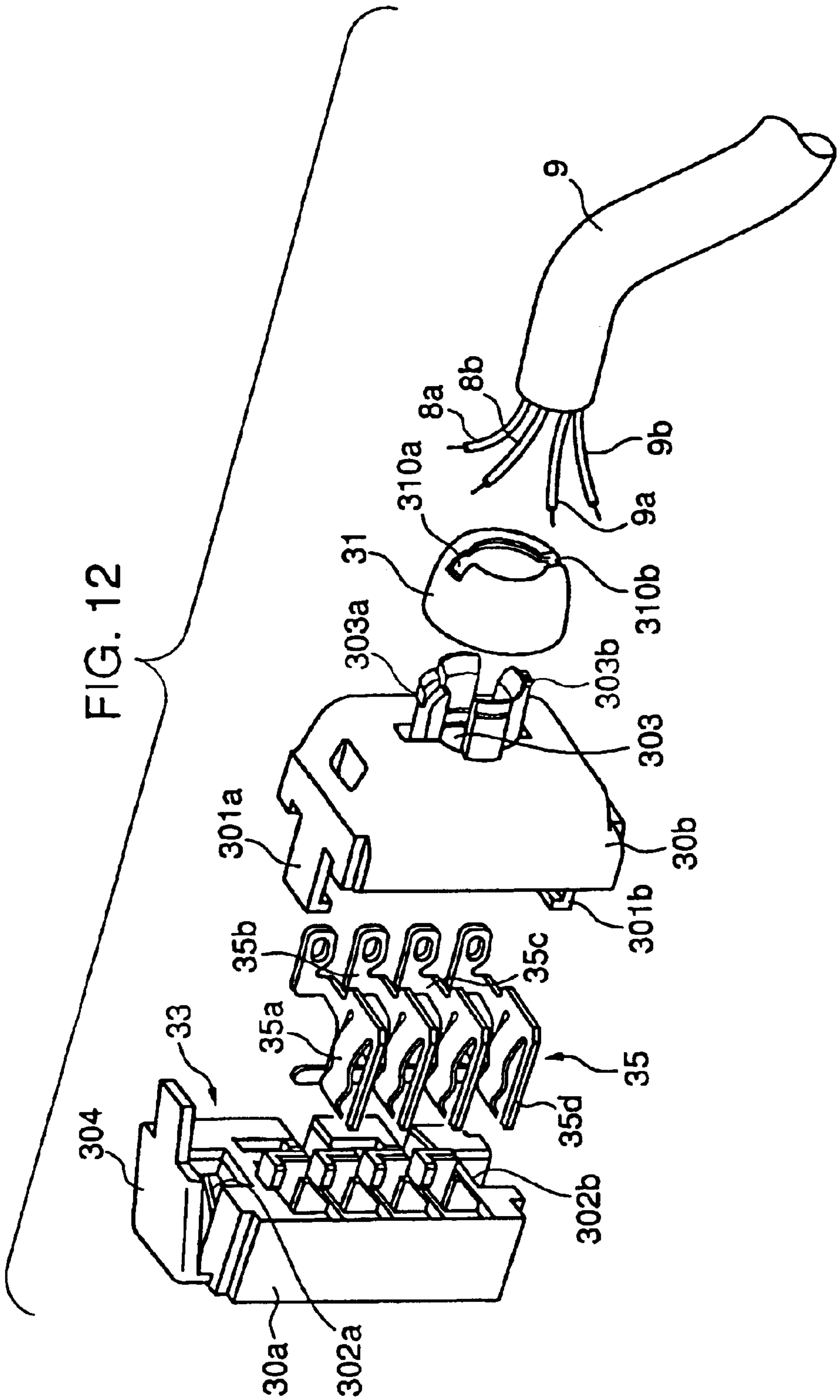
FIG. 12 is an exploded perspective view of the main connector shown in FIGS. 10A and 10B.

The structure of main connector 3 will be described with reference to FIGS. 10 to 13. FIG. 10 includes perspective views showing the appearance of the main connector, FIG. 11 is a front view of the main connector, FIG. 12 is an exploded perspective view of the main connector, and FIG. 13 shows, in enlargement, a distributor used for the main connector. FIG. 10A shows one side surface of the main connector provided with the joint for the neighboring connector for power feed, and FIG. 10B shows the other side surface of the main connector.

Main connector 3 is in many respects, similar to sub connector 2. Therefore, portions having the same structure as those of sub connector 2 will be represented by the reference characters common in the lower one digit (when the reference character consists of two digits) or lower two digits (when the reference character consists of three digits) to those used in the description of the sub connector 2, and detailed descriptions will not be repeated. For example, the stopper ring in FIGS. 10A and 10*b* is denoted by reference character 31.

Figure 10B:
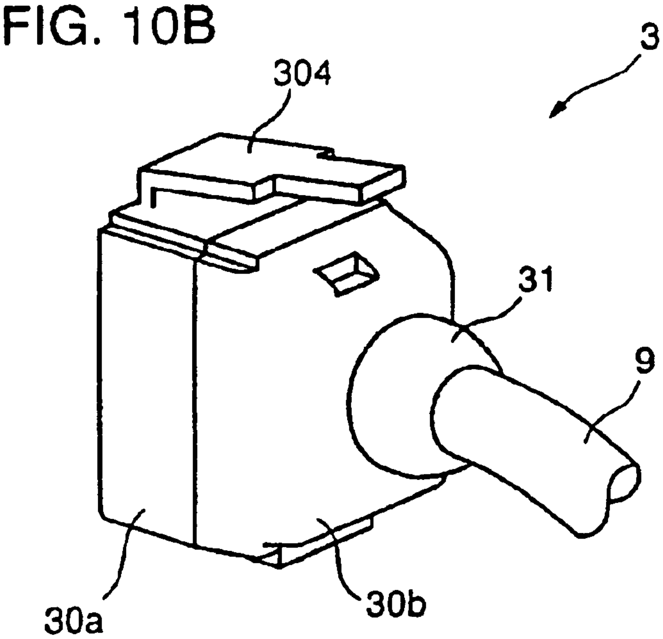

As shown in FIGS. 10A, 10B and 12, an electric cord 9 which is inserted to the rear connector housing 30*b* of the main connector includes, in addition to signal lines 8*a* and 8*b*, power feed lines 9*a* and 9*b*.

As can be seen from FIG. 10A, on one side of front connector housing 30*a*, there is provided a joint 33 for the neighboring connector for power feed, as in the sub connector 2. More specifically, engaging slot 331 and engaging slot 332 for receiving the clip piece 221 and the inserting piece 222 of the neighboring sub connector 2 are provided along the up/down direction, and between the engaging slot 331 and slot 332, there is an engaging hole 333 to which the power receiving terminal portion 253*b* of the neighboring sub connector 2 is inserted, and below the slot 332, there is the engaging hole 334 to which the power receiving terminal portion 253*d* is inserted. More specifically, the engaging slot 331 and slot 332 form recessed portions as mechanical structure for connection with the neighboring connector, and engaging holes 333 and 334 having the power feed terminals provided therein form recessed portions as electrical structure for connection with the neighboring connector.

By contrast, referring to FIG. 10B, there is no joint for the neighboring connector on the other side surface of the front connector housing 30*a*. This is because the main connector 3 is coupled to the sensor body 1*b* that is arranged on the left end of the sensor system, as shown in FIG. 1.

Figure 13A:
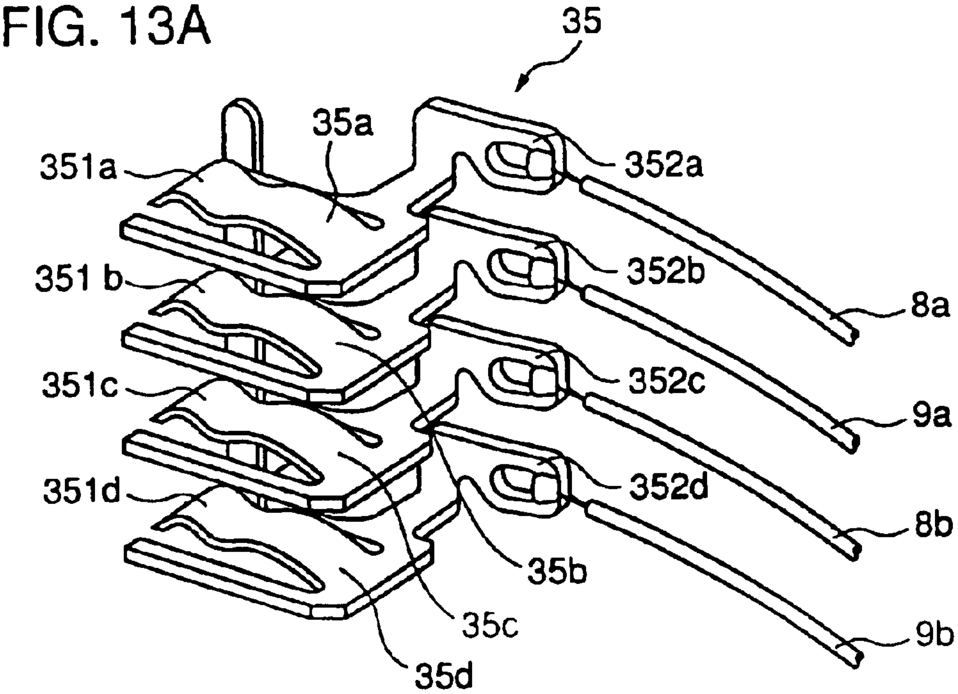
FIGS. 13A and 13B are enlarged perspective views of the appearance of the distributor used for the main connector of the sensor system shown in FIG. 1, viewed from two different directions.
Figure 13B:
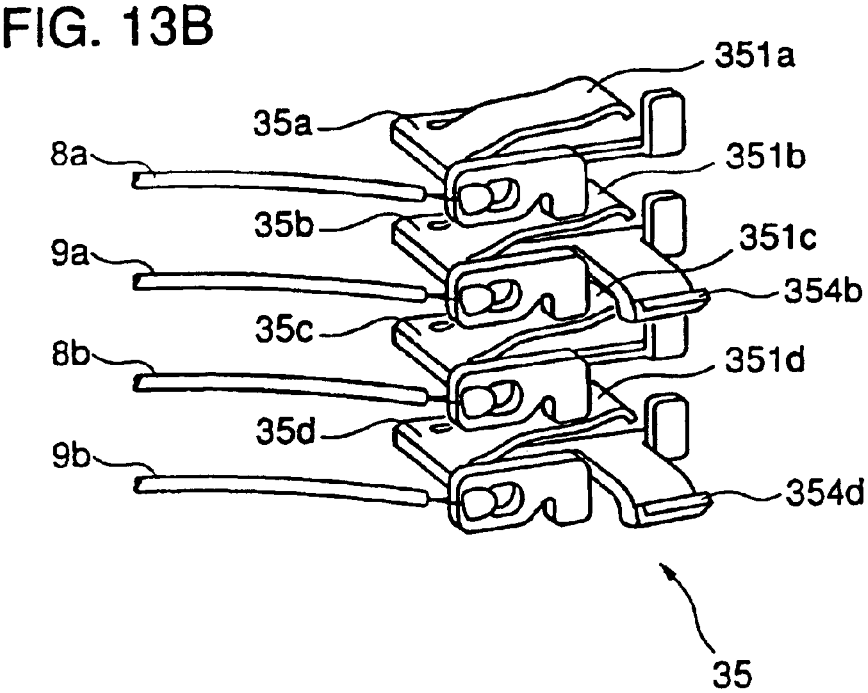

More specifically, power is received by the main connector not form the neighboring connector but from the power feed lines 9*a* and 9*b* contained in electric cord 9. Therefore, as shown in FIGS. 13A and 13B, internal conductor pieces 35*b* and 35*d* for power feed of a distributor 35 used in main connector 3 are not provided with the power receiving terminals (corresponding to the power receiving terminal portions 253*b* and 253*d* of the sub connector) for receiving the power from the neighboring connector. In place thereof, power feed lines 9*a* and 9*b* are connected to line connection terminal portions 352*b* and 352*d* of power receiving conductor pieces 35*b* and 35*d*, and the power is passed from power feed lines 9*a* and 9*b* to power feed conductor pieces 35*b* and 35*d*. Therefore, the power feed terminal portion is not exposed on that side of the main connector on which the neighboring connector does not exist (the side which will be the left side surface of the sensor system in FIG. 1), and therefore the risk of electrical short-circuit or receiving electrical shock by accidentally touching the power feed terminal portion can be avoided.

The mechanical and electrical connecting structures for the neighboring connector provided on one side (closer to the main connector) of the sub connector have projected shapes, and the mechanical and electrical connecting structure with the neighboring connector provided on the other side (farther from the main connector) of the sub connector have recessed shapes to receive the protrusions. Further, the mechanical and electrical connecting structures provided only on the right side of the main connector also have the recessed shapes. Therefore, in the row of connectors formed by mutually connecting these connectors, the connecting structure of the nth sub connector positioned on the right end (represented by 2*n* in FIG. 1) does not have the protruded portion on the side where the neighboring connector does not exist.

More specifically, there is no projection on either side of the row of connectors. Therefore, the row of sensors to which the connectors are connected can be placed in tight contact with other devices aligned on the DIN rail.

If there is a projection protruding from an end of the row of sensors, it is possible that an operator's clothes may be accidentally caught on the projection, or something may possibly hit the protrusion. The present embodiment eliminates such a possibility. The joint for the neighboring connector on the side, on which the neighboring connector does not exist, of the sub connector arranged at the distal end of the row of sensors may be covered by applying a sticker, for example, so that the connecting structure is concealed. This may further enhance electrical safety.

When main connector 3 and sensor body 1 are coupled, power receiving terminal pins 14*b* and 14*d* of sensor body 1 are inserted to slots 341*b* and 341*d* for the power receiving terminal pins shown in FIG. 11, respectively. At this time, power feed terminal portion 351*b* for the sensor body of power internal conductor piece 35*b* presses power receiving terminal pin 14*b* from below, the power feed terminal portion 351*d* for the sensor body of power conductor piece 35*d* presses power receiving terminal pin 14*d* from below, and these are electrically connected to each other.

When main connector 3 and a neighboring sub connector 2 are coupled, power feed terminal portion 354*b* for the neighboring connector of power conductor piece 35*b* presses power receiving terminal portion 253*b* of the neighboring connector 2 from above, and power feed terminal portion 354*d* for the neighboring connector presses the power receiving terminal portion 253*d* of the neighboring connector from above, and these are electrically connected to each other.

More specifically, when main connector 3 and sensor body 1 are coupled, power lines 9*a* and 9*b* connected to main connector 3 are electrically connected to power receiving terminal pins 14*b* and 14*d* of the sensor body through power conductor pieces 35*b* and 35*d* of main connector 3, and when main connector 3 and the neighboring sub connector 2 are coupled, the power lines 9*a* and 9*b* are electrically connected to power receiving terminal portions 253*b* and 253*d* of the neighboring sub connector 2, through power conductor pieces 35*b* and 35*d* of main connector 3.

By the above described structure, the present embodiment enables connection of one main connector 3 and a plurality of sub connectors $2_1$ to 2*n* with the corresponding sensor bodies 1 (1*b*, $1a_1$, to 1*an*), and in addition, enables feeding of power supplied to the main connector 3 to each sensor body 1, by forming a row of connectors by coupling the connectors with each other.

Figure 14:
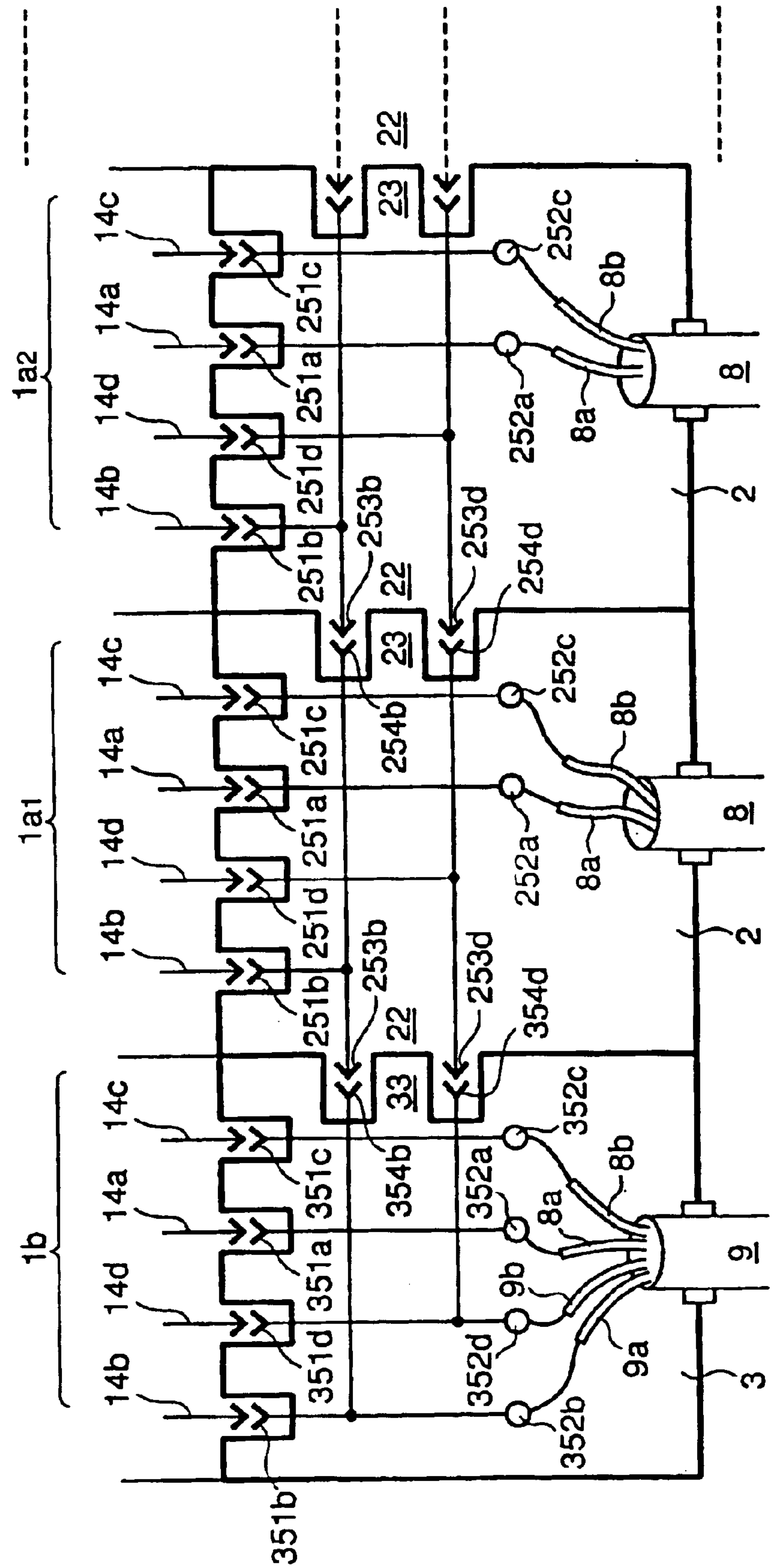
FIG. 14 is a circuit diagram schematically showing the feeding and receiving of power to the sensor bodies and transmission and reception of signals from the sensor bodies to the signal lines, when the sensor bodies and main and sub connectors are coupled in the sensor system shown in FIG. 1.

FIG. 14 schematically shows the manner how the power is fed to the sensor body through the row of connectors and how the signals are passed from the sensor bodies to the signal lines 8*a* and 8*b* through the connectors in accordance with the present embodiment. For convenience, only the main connector 3 and sub connectors $2_1$ and $2_2$ are shown as connectors, and only the sensor bodies 1*b* and $1a_1$ and $1a_2$ connected to these connectors are shown as the sensor bodies 1.

As can be seen from the figure, a control output and an analog output transmitted from the sensor body 1 (1*b*, $1a_1$, $1a_2$) to which the main connector 3 or the sub connector 2 is connected are passed through internal conductor piece 35*a*, 35*c*, 25*a* or 25*c* for the signals of each connector and signal terminal pins 14*a*, 14*c* to signal lines 8*a*, 8*b*. Accordingly, signal transmission from the sensor body 1 (1*b*, $1a_1$, $1a_2$) to control device such as a PLC, becomes possible.

The power introduced from power lines 9*a* and 9*b* of main connector 3 is passed to power receiving terminal pins 14*b* and 14*d* of sensor body 1*b* to which main connector 3 is connected, through power internal conductor pieces 35*b* and 35*d* of main connector 3. Thus, the power is supplied to the circuit board in sensor body 1*b*.

At the same time, the power introduced from power lines 9*a* and 9*b* of main connector 3 is passed through power conductor pieces 35*b* and 35*d* of main connector 3 to power receiving terminal portions 253*b* and 253*d* of the first neighboring sub connector 2. Further, the power received by the power receiving terminal portions 253*b* and 253*d* of the first neighboring connector 2 is passed through power internal conductor pieces 25*b* and 25*d* to power receiving terminal pins 14*b* and 14*d* of sensor body $1a_1$. Thus, the power introduced from electric cord 9 (power lines 9*a*, 9*b*) to main connector 3 is supplied to the circuit board in sensor body $1a_1$.

Further, the power received at power receiving terminal portions 253*b* and 253*d* of first sub connector 2 is passed through the power internal conductor pieces 25*b* and 25*d* of first sub connector 2 to power receiving terminal portions 253*b* and 253*d* of the neighboring sub connector 22. The power received by the power receiving terminal portions 253*b* and 253*d* of the neighboring second sub connector 2 is passed through power internal conductor pieces 25*b* and 25*d* of the second sub connector 2 to power receiving terminal pins 14*b* and 14*d* of sensor body $1a_2$. Accordingly, the power introduced to main connector 3 is supplied to the circuit board of sensor body $1a_2$.

In this manner, in the sensor system in accordance with the present embodiment, the power introduced to the main connector 3 is successively passed to the plurality of sub connectors 2 arranged in contact with each other to form a row following main connector 3, and further supplied to the circuit boards of the sensor bodies 1 (1*b*, $1a_1$, to 1*an*) to which the connectors 2 and 3 are connected. More specifically, by the connector system of the main connector 3 and a plurality of sub connectors 2, a power supply line is implemented.

Figure 15:
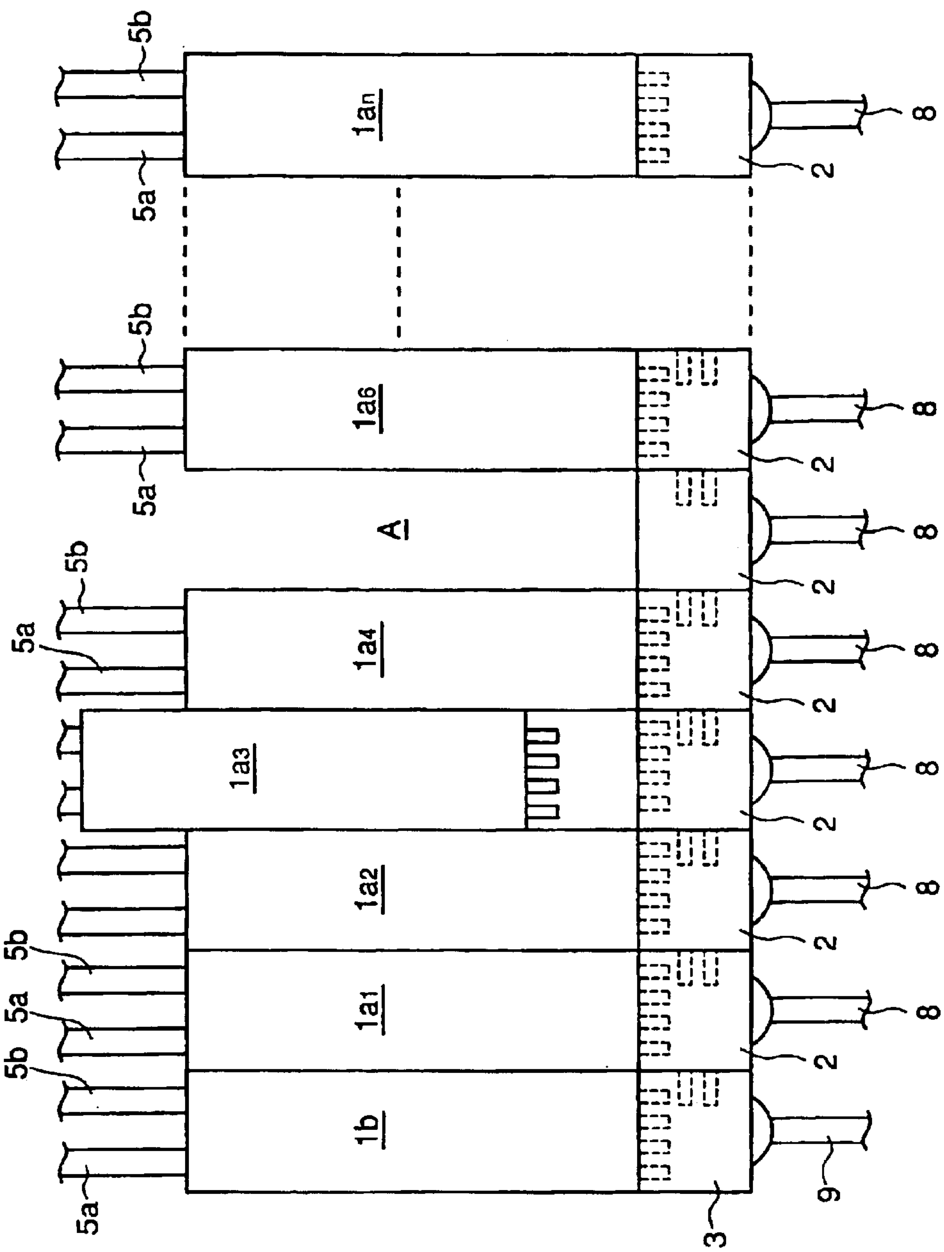
FIG. 15 is an illustration representing the function of the sensor system shown in FIG. 1.

The structure of the sensor system in accordance with the embodiment described above can be schematically represented by FIG. 15. Mores specifically, the power supplied to main connector 3 is supplied through the row of connectors consisting of the main connector 3 and the plurality of sub connectors 2 to the circuit boards in the sensor bodies 1 (1*b*, $1a_1$ to 1*an*) to which respective connectors are connected, and therefore it becomes unnecessary to connect a power feed line (power feed lines 9*a*, 9*b* of electric cord 9) to each sensor. Thus, the number of power feed liens for the overall system can significantly be reduced.

In addition, power feed through the electric cord 9 is effected through main connector 3. Therefore, sensor bodies having the common structure can be used as the sensor bodies 1, regardless of whether the main connector or the sub connector is to be connected thereto. Therefore, as compared with the conventional sensor system in which the power is fed and received between the sensor bodies, the number of parts and steps of managing the parts can be reduced, resulting in reduced cost. Further, there is no distinction between the main and sub sensors, inventory management of the sensor bodies themselves is facilitated.

Each connector 2, 3 is detachably coupled to sensor body 1. Therefore, when a sensor body fails as schematically shown by the reference character $1a_3$ in the figure, it is possible to simply exchange the failed sensor body $1a_3$, while maintaining the third electric cord 8 which has been connected to connector 2.

Further, if it is made possible to draw out the sensor body from the connector while maintaining coupling between neighboring connectors, then, it becomes possible, even when a sensor body is absent in the middle of the row of sensors, for example to exchange the sensor body as schematically represented by the reference character A in the figure, to maintain power supply to the sensor bodies $1a_6$ to 1*an* following the absent portion.

Further, as the neighboring connectors can be detachably coupled to each other, it becomes possible to increase/decrease the number of sensors to be arranged.

Though detailed description is not given as it is not directly related to the present invention, it is possible by the sensor system in accordance with the present embodiment to perform optical communication between the sensor bodies through light emitting/receiving windows 11*a* and 11*b* shown in FIGS. 1 to 4B. Therefore, in the present embodiment, by relaying a control output and analog output transmitted from each sensor body 1 to the neighboring sensor bodies one by one for transmission/reception, signal transmission from a dedicated communication unit arranged at an end of the row of sensors to the control device such as the PLC through a serial communication in collective manner is possible. By this configuration, it becomes unnecessary to draw out an electric cord 8 (signal lines 8*a*, 8*b*) from each sensor, and therefore, the number of lines of the overall sensor system can further be reduced.

Figure 16:
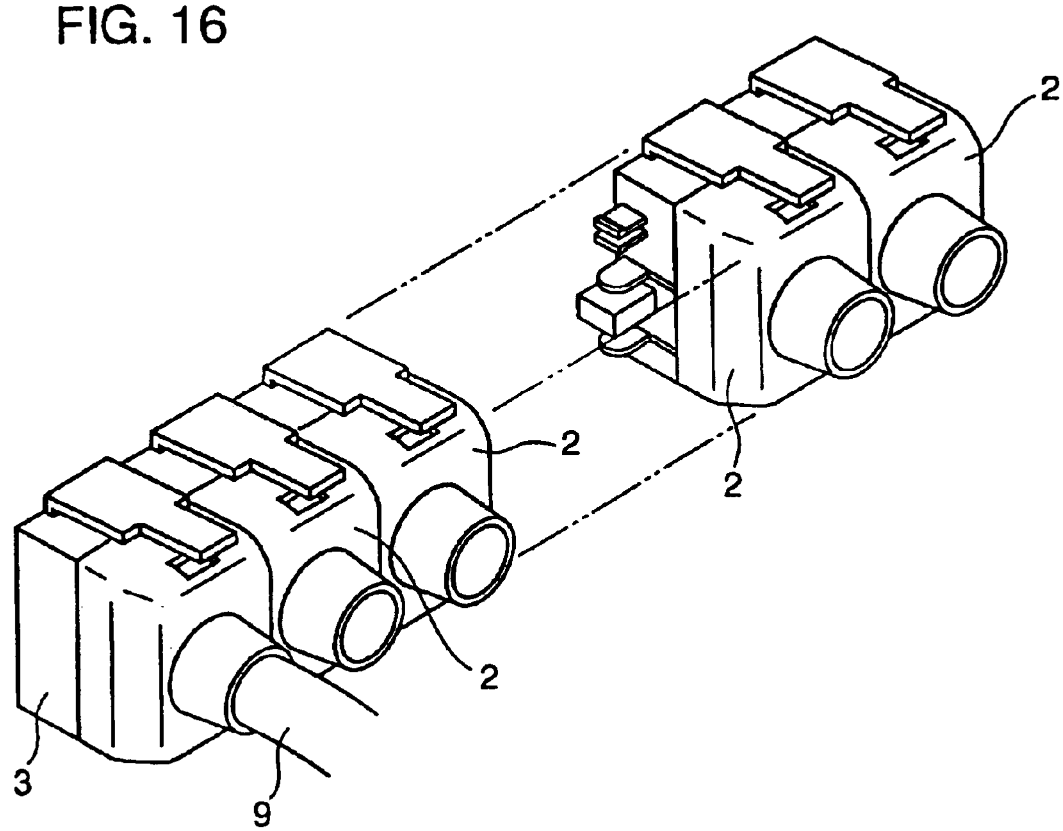
FIG. 16 is a perspective view showing another example of the row of connectors of the sensor system in accordance with the present invention.
Figure 17:
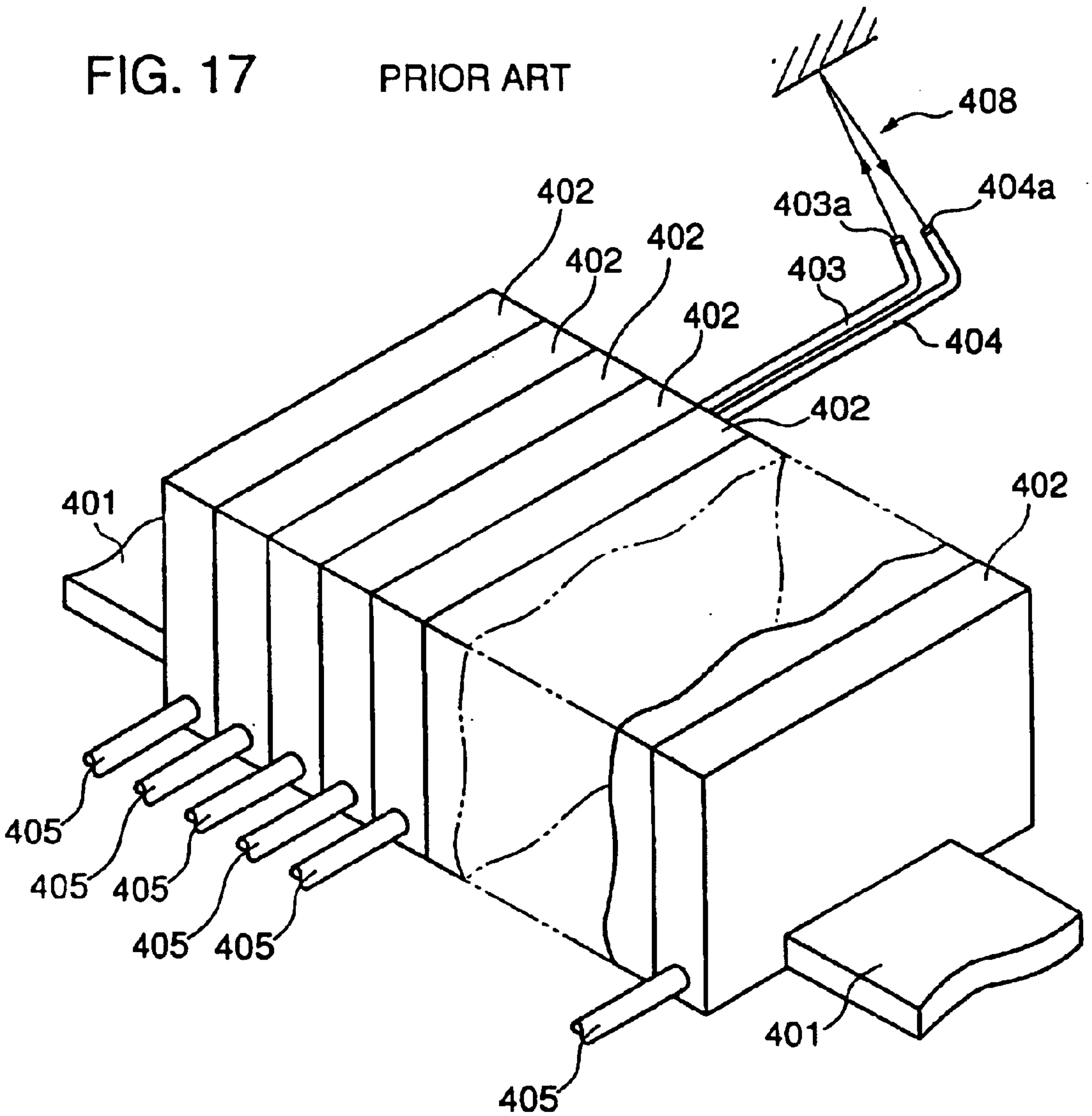
FIG. 17 is a perspective view schematically showing the overall conventional sensor system.
Figure 18:
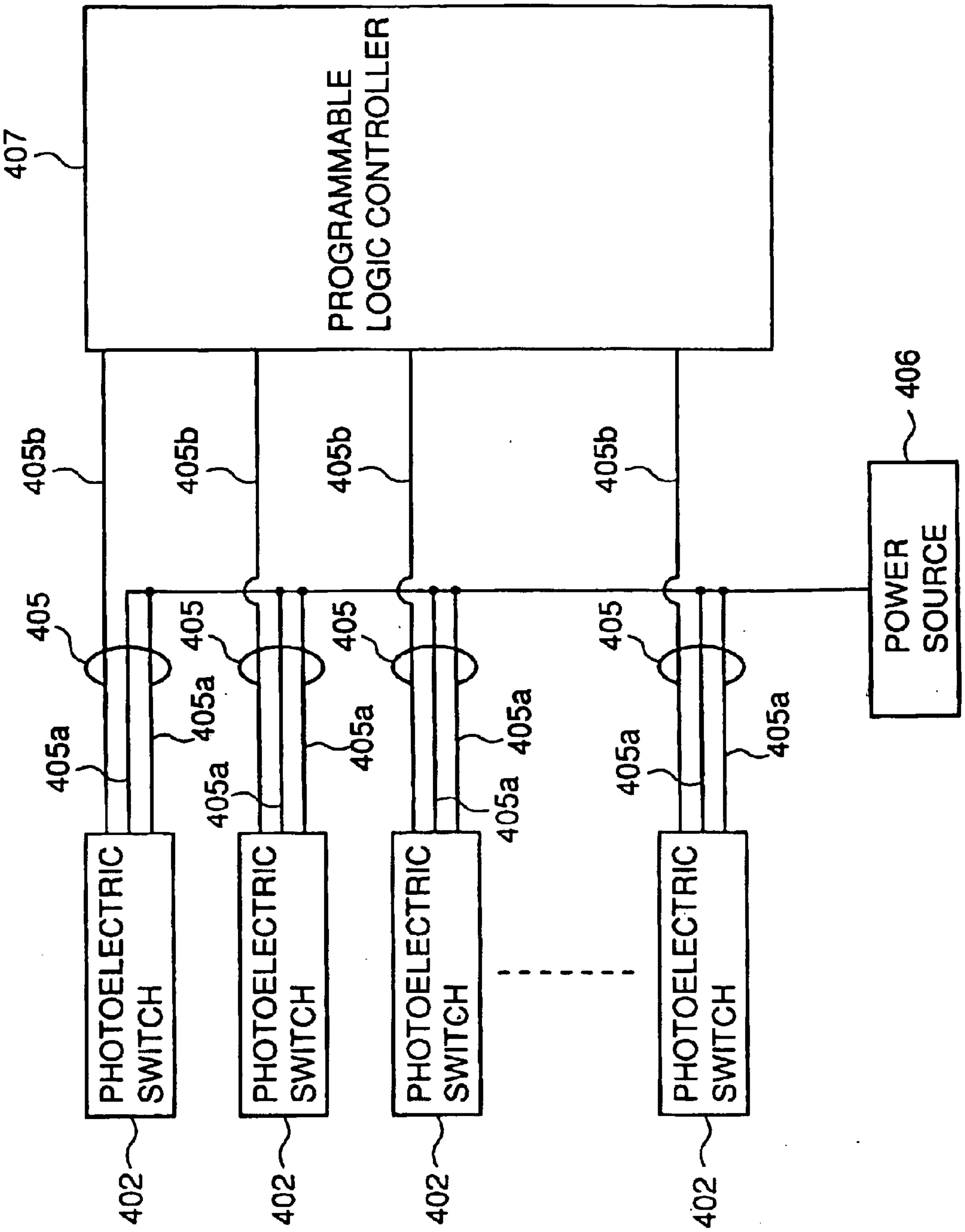
FIG. 18 is an illustration representing the method of power feeding in the conventional sensor system.

FIG. 16 shows an example of the row of connectors having such a configuration. As shown in this figure, an electric cord 9 is drawn out from the main connector 3 positioned at the left end of the row of connectors. From the plurality of sub connectors 2, however, there is not any electric cord drawn out. More specifically, the sub connectors 2 are each used as a simple power feeding connector.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A main connector, having a connector body that can be detachably coupled to one of a plurality of sensor bodies arranged aligned and in contact with each other, and an electric cord including a power feed line; wherein said connector body includes:

a first joint for a sensor body, including a power feed terminal adapted for feeding power to an internal electric circuit of the sensor body, and a first connecting structure configured for mechanically and detachably fixing the first joint to the sensor body, the first connecting structure including an elastic projection portion;

a second joint for a neighboring connector, including a power feed terminal configured for feeding power to the neighboring connector, and a second connecting structure configured for mechanically and detachably fixing the second joint to the neighboring connector, the second connecting structure including an engaging slot, the engaging slot arranged in and passing through an endface of the second joint; and an internal conductor for conducting the power fed through said electric cord to the power feed terminal included in said first joint and to the power feed terminal included in said second joint, inside the main connector.

2. The main connector according to claim 1, wherein the second joint further comprises an engaging hole, the engaging hole arranged in the endface of the second joint.

3. The main connector according to claim 1, wherein the engaging slot comprises stepped portions arranged in the engaging slot.

4. The main connector according to claim 1, wherein said electric cord introduced to said main connector includes, in addition to the power feed line, one or two or more signal lines, said first joint for the sensor body of said connector body includes a corresponding number of signal terminals, and an internal conductor coupling respective ones of the signal lines of said electric cord to the corresponding signal terminals of said first joint for the sensor body is provided in said connector body.

5. The main connector according to claim 1, wherein said second joint for the neighboring connector of said connector body is provided only on one side surface, and no joint exists on the other side surface.

6. The main connector according to claim 1, wherein a connecting structure for establishing mechanical and electrical connections with a neighboring connector is provided at said second joint for the neighboring connector of said connector body; and the connecting structure has a recessed portion receiving a projecting portion of a neighboring connector, and is free of any projecting portion protruding toward a neighboring connector.

7. A sub connector, having a connector body that can be detachably coupled to one of a plurality of sensor bodies arranged on, and substantially completely above, a rail, said connector body including:

a first joint for a sensor body, including a power feed terminal adapted for feeding power to the internal electric circuit of said sensor body;

a second joint for a first neighboring connector, including a power receiving terminal for receiving power from one neighboring connector;

a third joint for a second neighboring connector, including a power feed terminal for feeding power to the other neighboring connector; and an internal conductor for conducting the power received through the power receiving terminal included in said second joint, to the power feed terminal included in said first joint and to the power feed terminal included in said third joint, inside the sub connector, and wherein the first, second and third joints are arranged at a level above the rail when the connector body is coupled to the sensor body.

8. The sub connector according to claim 7, wherein a connecting structure for establishing mechanical and electrical connections with a neighboring connector is provided at said second joint for the first neighboring connector and said third joint for the second neighboring connector;

the connecting structure of said second joint for the first neighboring connector has a projecting portion protruding toward a connector neighboring said second joint for the first neighboring connector; and the connecting structure of said third joint for the second neighboring connector has a recessed portion receiving the projecting portion of a neighboring connector, and is free of any projecting portion protruding toward a neighboring connector.

* * * * *